United States Patent
Uratani et al.

(10) Patent No.: US 7,447,289 B2
(45) Date of Patent: Nov. 4, 2008

(54) SIGNAL TIMING ADJUSTMENT DEVICE, SIGNAL TIMING ADJUSTMENT SYSTEM, SIGNAL TIMING ADJUSTMENT AMOUNT SETTING PROGRAM, AND STORAGE MEDIUM STORING THE PROGRAM

(75) Inventors: Munehiro Uratani, Tsukuba (JP); Eiichi Takahashi, Tsukuba (JP); Yuji Kasai, Tsukuba (JP); Tetsuya Higuchi, Tsukuba (JP); Masahiro Murakawa, Tsukuba (JP)

(73) Assignees: Sharp Kabushiki Kaisha, Osaka (JP); National Institute of Advanced Industrial Science and Technology, Tokyo (JP)

( * ) Notice: Subject to any disclaimer, the term of this patent is extended or adjusted under 35 U.S.C. 154(b) by 805 days.

(21) Appl. No.: 10/809,374

(22) Filed: Mar. 26, 2004

(65) Prior Publication Data

US 2004/0190665 A1    Sep. 30, 2004

(30) Foreign Application Priority Data

Mar. 31, 2003    (JP) .............................. 2003-097007

(51) Int. Cl.
*H04L 7/00* (2006.01)

(52) U.S. Cl. .................. 375/371; 375/354; 375/355; 375/356; 375/357; 375/358; 327/158; 327/146; 327/149; 327/153; 327/161

(58) Field of Classification Search ............... 375/354; 327/156, 157, 158, 146, 147, 149, 155, 153, 327/161, 192, 206, 207, 210, 214, 224
See application file for complete search history.

(56) References Cited

U.S. PATENT DOCUMENTS

| | | | | |
|---|---|---|---|---|
| 5,251,172 A | * | 10/1993 | Yamauchi | 365/189.09 |
| 5,912,591 A | * | 6/1999 | Yamada | 331/57 |
| 6,192,092 B1 | | 2/2001 | Dizon et al. | |
| 6,252,447 B1 | * | 6/2001 | McClure | 327/175 |
| 6,424,184 B1 | * | 7/2002 | Yamamoto et al. | 327/102 |
| 6,501,311 B2 | * | 12/2002 | Lutkemeyer | 327/161 |
| 6,593,792 B2 | * | 7/2003 | Fujii | 327/276 |
| 6,657,467 B2 | * | 12/2003 | Seki et al. | 327/158 |

(Continued)

OTHER PUBLICATIONS

Kurd et al., IEEE Journal of Solid-State Circuits, vol. 36, No. 11, pp. 1647-1653 (2001).

(Continued)

*Primary Examiner*—Chieh M. Fan
*Assistant Examiner*—Siu M Lee
(74) *Attorney, Agent, or Firm*—Birch, Stewart, Kolasch & Birch, LLP

(57) ABSTRACT

Delay time between an input of data to a circuit block and an output of the data from the data block is measured in accordance with a timing at which the data from the circuit block is acquired by a measurement register and a timing at which the data from the circuit block is acquired by a data latch. An LSI tester sets well voltage adjustment values so that delay time of each circuit block is averaged. From voltages generated by the adjustment voltage generating circuit, a selector selects voltages that are in accordance with the well voltage adjustment values. The voltages selected are applied to a well of a CMOS transistor of each clock timing adjustment circuit. Delay time between timings of inputted clocks is thus adjusted.

8 Claims, 19 Drawing Sheets

U.S. PATENT DOCUMENTS

| | | | |
|---|---|---|---|
| 6,711,044 B2 * | 3/2004 | Yamauchi | 365/63 |
| 6,909,316 B2 * | 6/2005 | Owens et al. | 327/266 |
| 7,088,172 B1 * | 8/2006 | Lesea et al. | 327/543 |
| 2001/0049797 A1 * | 12/2001 | Mullarkey | 713/401 |

OTHER PUBLICATIONS

Deleganes et al., 2002 Symposium on VLSI Circuits Digest of Technical Papers, 4 pages.

* cited by examiner

SIGNAL TIMING ADJUSTMENT DEVICE, SIGNAL TIMING ADJUSTMENT SYSTEM, SIGNAL TIMING ADJUSTMENT AMOUNT SETTING PROGRAM, AND STORAGE MEDIUM STORING THE PROGRAM

This nonprovisional application claims priority under 35 U.S.C. § 119(a) on Patent Application No. 2003/097007 filed in Japan on Mar. 31, 2003, the entire contents of which are hereby incorporated by reference.

FIELD OF THE INVENTION

The present invention relates to a signal timing adjustment in an integrated circuit such as a CPU (Central Processing Unit), an ASIC (Application Specific Integrated Circuit), a DSP (Digital Signal Processor), a memory, an analog LSI (Large Scale Integrated Circuit), and the like.

BACKGROUND OF THE INVENTION

It is a conventional dilemma that, while a drastic improvement of an operating frequency is needed in response to an increasingly superfine LSI process, a wire delay time caused by a wire resistance is increased. It is therefore very difficult to simultaneously optimize properties of an LSI at a designing stage, the characteristics being such as an operating frequency and power consumption. Because reduction of power consumption is a most significant challenge especially for recent high-performance LSIs, some of the recent high-performance LSIs are configured at a designing stage to be less power-consuming, and a timing adjustment for optimizing a clock frequency is performed after an wafer process is completed.

Related art on a clock skew adjustment is described in the following publications, for example:
(1) U.S. Pat. No. 6,192,092 (date of patent: Feb. 20, 2001);
(2) Nasser A. Kurd, Javed S. Barkatullah, Rommel O. Dizon, Thomas D. Fletcher, and Paul D. Madland, "A Multigigahertz Clocking Scheme for the Pentium(R) 4 Microprocessor", *IEEE Journal of Solid State Circuits*, Vol. 36, No. 11, November 2001, pp. 1647-1653; and
(3) Daniel Deleganes, Jonathan Douglas, Badari Kommandur, Marek Patyra, "Designing a 3 GHz, 130 nm, Pentium(R) 4 Processor", 2002 *Symposium on VLSI Circuits Digest of Technical Papers*.

FIGS. 18 and 19 illustrate art related to the clock skew adjustment, the art being excerpted from the United States Patent and the theses mentioned above.

FIG. 18 schematically illustrates clock skew detection and a compensating circuit in the related art. In FIG. 18, clock skew values of two clock domains, i.e. a local clock domain 1 and a local clock domain 2, are detected at a skew detection, and then transferred to a tester interface. A global clock duty cycle control adjusts a ratio of a duty cycle of a clock supplied to an LSI as a whole.

A tester (not shown) sets an adjustment value for a skew adjustment control circuit comp1 control or comp2 control so as to minimize a skew value. In accordance with the value set by the tester, a circuit of FIG. 19 described later adjusts a timing of each clock by adjusting rising time or falling time of the local clock domain 1 or the local clock domain 2. Values supplied from the tester are respectively programmed in a fixing manner into a prom by a prom comp1 setting and a prom comp2 setting, so that the values are stored.

FIG. 19 more specifically illustrates the clock skew compensating circuit of FIG. 18.

In FIG. 19, a first stage of a programmable delay buffer 200 is provided for adjusting the falling time, and a second stage of the programmable delay buffer 200 is provided for adjusting the rising time. Each of the first stage and the second stage includes a PMOS pull-up transistor, eight inverters 215 or 225, and eight switches (pull-down paths s0 to s7). A 5-bit control register 130 and a 3-to-8 decoder 140 decode a control signal (control bits), and supply the control signal to the programmable delay buffer 200. The 5-bit control register 130 and the 3-to-8 decoder 140 are the comp1 control and the comp2 control, respectively.

In this arrangement, the falling time and the rising time are adjusted by using the number of switches (among the eight switches) that are turned ON by the adjustment value supplied from the tester.

However, because this adjustment method requires a large number of switches and inverters, there is a problem that a large circuit size is required in order to perform a clock skew adjustment.

In connection with this problem, there is a problem of trade-off between a freedom of adjustment (an adjustment range and adjustment fineness) and a small circuit size. For example, in order to double the freedom of adjustment (the adjustment range or the adjustment fineness) in the circuit of FIG. 19, it is necessary to increase the number of the switches from eight to 16. As a result, the circuit size of an adjusted part is also doubled. On the other hand, if the number of the switches is decreased, the circuit size is decreased, but a sufficient adjustment cannot be attained because the adjustment range and the adjustment fineness are insufficient.

SUMMARY OF THE INVENTION

The present invention was made in light of the foregoing problems. An object of the present invention is therefore to provide a signal timing adjustment device and the like that solve the problem of trade-off between the freedom of adjustment (the adjustment range and the adjustment fineness) and the small circuit size, by adjusting timings of clocks and the like continually or at very short intervals without increasing the circuit size.

In order to attain this object, a signal timing adjustment device of the present invention includes a voltage generating section for generating a plurality of adjustment voltages; a voltage selecting section for selecting, from the plurality of adjustment voltages, an adjustment voltage that is in accordance with a delay-time adjustment amount, which is set so that delay time of each circuit block in an integrated circuit becomes closer to an average value of the delay time, the delay time being time between an input of data to the circuit block and an output of the data from the circuit block; and a delay-adjustment section for increasing or decreasing the delay time by using a transistor at which a threshold voltage changes in accordance with a value of the adjustment voltage selected.

If an operating speed of each circuit block is different, the delay time is also different. In view of this fact, the signal timing adjustment device is arranged as follows. First, the delay-time adjustment amount is set so that the delay time of each circuit block becomes closer to the average value of the delay time. The delay-time adjustment amount is set by an external device or the like in accordance with each delay time measured. Then, the voltage selecting section selects, from the plurality of adjustment voltages generated by the voltage generating section, the adjustment voltage that is in accordance with the delay-time adjustment amount. After that, the delay-adjustment section increases or decreases the delay time in accordance with the value of the adjustment voltage selected.

It is well-known that a threshold voltage of an MOS transistor can be changed by changing a well (or substrate) voltage of the MOS transistor. However, the present invention uses this effect in the delay-adjustment section. When the delay-adjustment section changes the threshold voltage in accordance with the value of the adjustment voltage selected, the delay time changes as follows. When the threshold voltage is increased, the transistor turns ON later than before. As a result, the delay time is increased. On the other hand, when the threshold voltage is decreased, the transistor turns ON earlier than before. As a result, the delay time is decreased.

With this arrangement, the delay time of each circuit block is adjusted to a value close to the average value of the delay time. Because the delay time is adjusted in accordance with the value of the adjustment voltage that is set in advance so that the difference between each circuit block becomes smaller, an adjustment parameter is the voltage only. Therefore, it is possible to broaden the adjustment range and to increase the adjustment fineness by simply changing the adjustment voltage continually, or increasing the number of the adjustment voltages.

A signal timing adjustment system of the present invention includes the signal timing adjustment device; a delay measurement section for measuring the delay time; an average value calculating section for calculating the average value of the delay time, the delay time having been measured by the delay measurement section; and an adjustment amount setting section for setting the delay-time adjustment amount so that a difference between the delay time and the average value becomes smaller, the average value having been calculated by the average value calculating section.

According to this arrangement, the delay time of each circuit block, the delay time having been measured by the delay measurement section, is calculated by the average value calculating section. Then, the adjustment amount setting section adjusts the delay-time adjustment amount so that the difference between the delay time and the average value becomes smaller, the average value having been calculated by the average value calculating section. In this way, the delay-time adjustment value to be supplied to the signal timing adjustment device is generated. By thus providing the average value calculating section, which requires a complex calculation, and the adjustment amount setting section separately from the signal timing adjustment section, it is possible to perform the timing adjustment efficiently.

In the signal timing adjustment system, a signal timing adjustment amount setting program of the present invention causes a computer to function as the average value calculating section and the adjustment amount setting section. With this program, it is easy to set the delay-time adjustment amount and a set value by using an external device such as an LSI tester.

For a fuller understanding of the nature and advantages of the invention, reference should be made to the ensuing detailed description taken in conjunction with the accompanying drawings.

DESCRIPTION OF THE EMBODIMENTS

With reference to FIGS. 1 to 17, the following describes one embodiment of the present invention.

Figure 2:
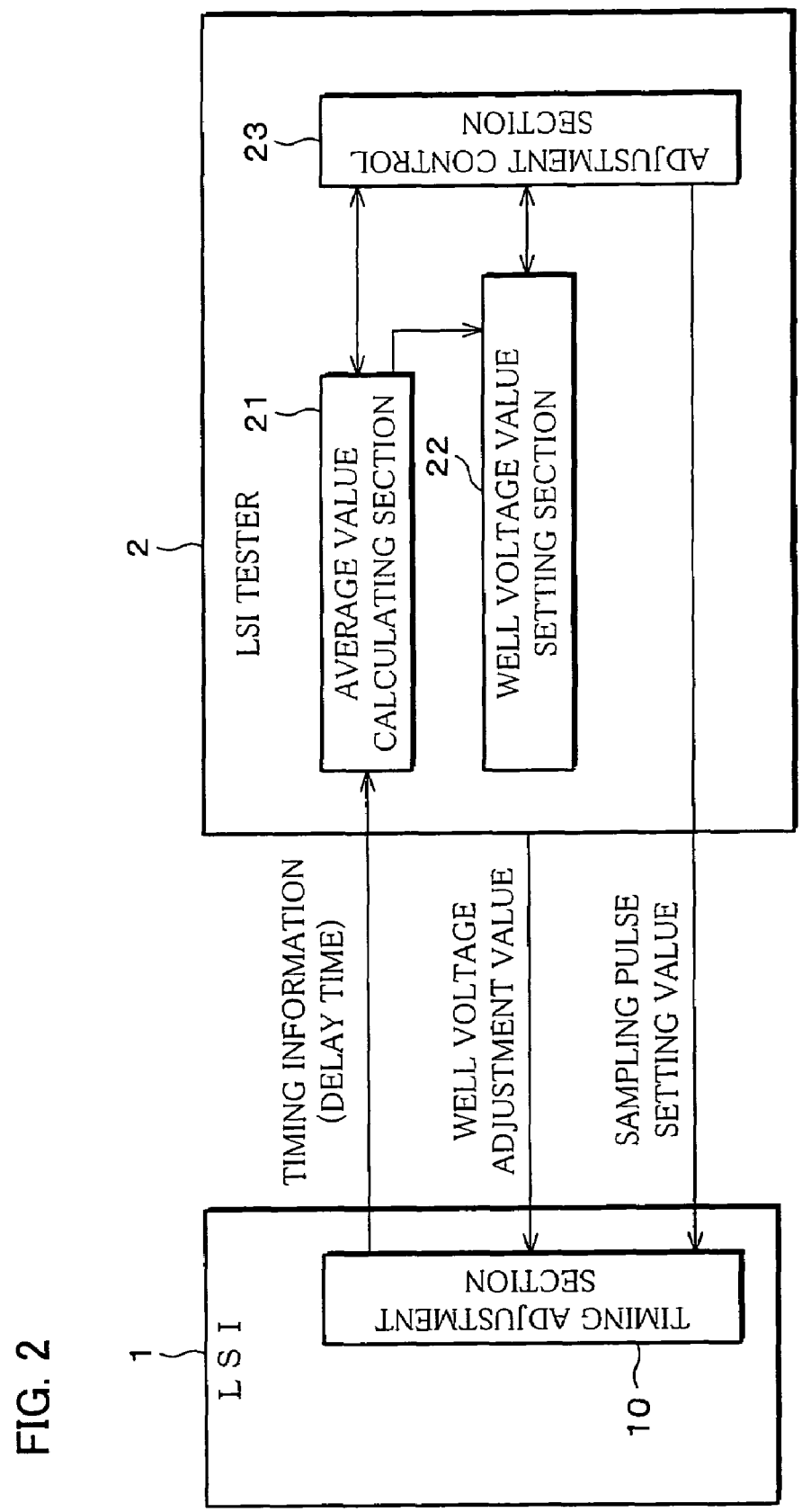
FIG. 2 is a block diagram illustrating a schematic arrangement of the timing adjustment system.

FIG. 2 illustrates an arrangement of a timing adjustment system of the present invention.

As shown in FIG. 2, the present timing adjustment system performs a timing adjustment and a clock waveform adjustment that are for clocks respectively supplied to blocks of an LSI. The timing adjustment system includes a timing adjustment section 10 and an LSI tester 2. The timing adjustment section 10 is contained in the LSI 1, which is a target of the adjustment.

The timing adjustment section 10 supplies timing information to the LSI tester 2. The timing information is clock delay time of each block. The timing adjustment section 10 measures the delay time in accordance with a test pattern supplied from the LSI tester 2. Furthermore, the timing adjustment section 10 sets a well voltage of an NMOS transistor and a well voltage of a PMOS transistor in accordance with well voltage adjustment values supplied from the LSI tester 2. The NMOS transistor and the PMOS transistor constitute an inverter for adjusting a clock timing.

The LSI tester 2 is a test device for measuring a logical function, an electric property, and the like of the LSI 1. For the measurement, the LSI tester 2 includes a test unit including a pattern generator, a timing generator, a waveform shaper, a logical comparator, a power source unit, and the like. In order to perform automatic measurement according to a condition set by a program, the LSI tester 2 includes a control section for controlling the test unit. The control section includes an MPU (Micro Processor Unit) as a main part thereof, and performs a computing function.

In order to perform processing for the timing adjustment, the LSI tester 2 includes an adjustment program. The LSI tester 2 includes a functional block including an average value calculating section 21, a well voltage value setting section 22, and an adjustment control section 23. The functional block is realized by the adjustment program. The functional block performs various kinds of processing for the timing adjustment by using hardware, such as the MPU.

The average value calculating section 21 calculates an average value of the delay time in accordance with the timing information supplied from the timing adjustment section 10. The well voltage value setting section 22 (an adjustment amount setting section) sets the well voltage adjustment values to be supplied to the timing adjustment section 10. The adjustment control section 23 performs such functions as controlling the average value calculating section 21 and the well voltage value setting section 22, and evaluating an operating frequency. The adjustment control section 23 also generates a sampling pulse setting value to be supplied to a sampling pulse generating circuit 131 (see FIG. 8), which is described later. Processing performed by the average value calculating section 21, the well voltage value setting section 22, and the adjustment control section 23 are described later in detail.

The adjustment program may be in a form of a storage medium storing the adjustment program. There is no particular limitation as to the storage medium, as long as the storage medium is capable of storing the adjustment program, and the adjustment program stored in the storage medium is readable for a computer (a computing section of the LSI tester 2). For example, it does not matter whether the storage medium is rewritable or non-rewritable, volatile or non-volatile. Moreover, the storage medium is not limited to that of a particular storage method, and that of a particular shape. Examples of the storage medium are a tape such as an electromagnetic tape, an electromagnetic disk such as a flexible disk and a hard disk, and a disk such as a CD-ROM, a magnetooptical disc (MO), a mini disk (MD), and a digital video disk (DVD). The storage medium may be a card such as an IC card and an optical card, or a semiconductor memory such as a mask ROM, an EPROM, an EEPROM, and a flash ROM.

Figure 3:
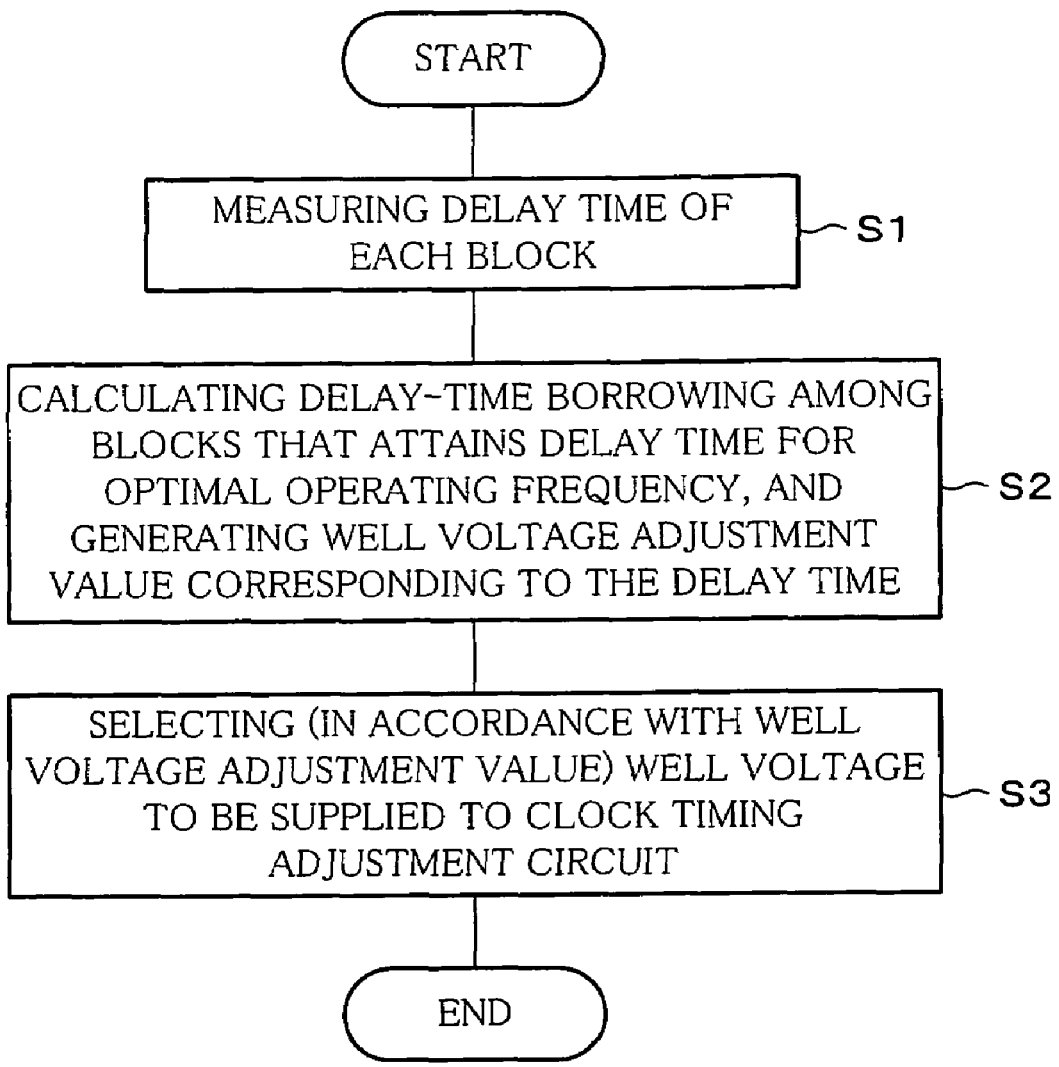
FIG. 3 is a flowchart schematically illustrating steps of a timing adjustment performed by the timing adjustment system.
Figure 4:
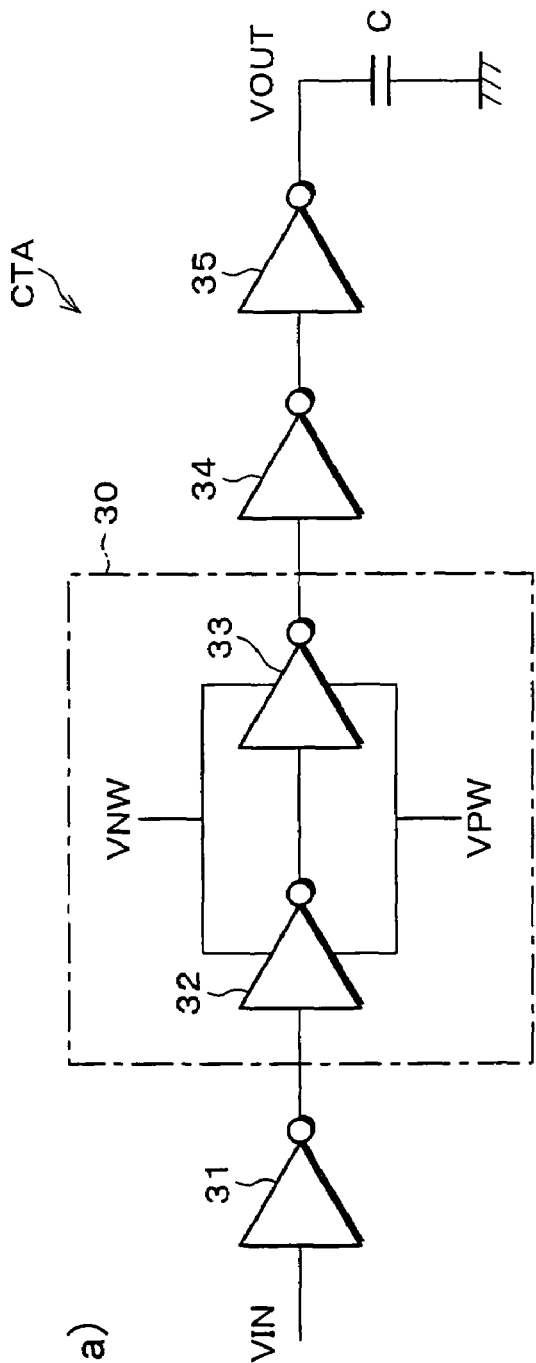
FIG. 4(a) is a circuit diagram illustrating an arrangement of a clock timing adjustment circuit of the timing adjustment section.
FIG. 4(b) is a circuit diagram illustrating an arrangement of an inverter of an adjustment section of the clock timing adjustment circuit.
Figure 4:
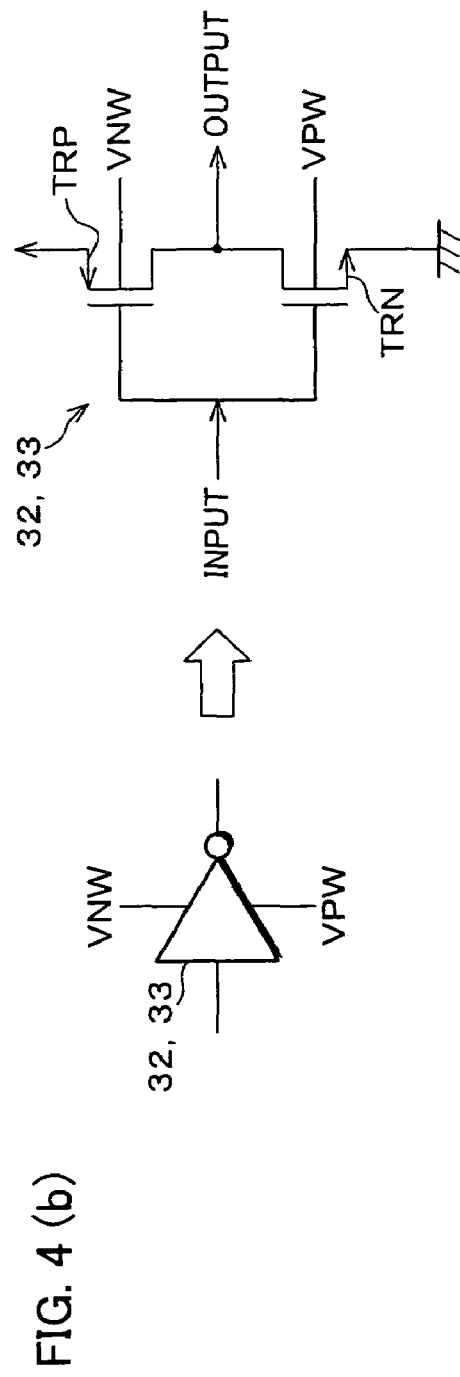

FIG. 3 is a flowchart schematically illustrating steps of the timing adjustment performed by the timing adjustment system.

As shown in FIG. 3, the timing adjustment section 10 measures delay time of each circuit block in the LSI 1 (S1). The result is transmitted to the LSI tester 2. Then, the LSI tester 2 calculates delay-time borrowing among circuit blocks, and from a result of calculation, generates well voltage adjustment values to be supplied to the timing adjustment section (S2). The delay-time borrowing is determined so as to attain such delay time that optimizes an operating frequency of the LSI as a whole. The LSI tester 2 calculates the delay-time borrowing by considering, for example, a data transmission order among circuit blocks. In accordance with the well voltage adjustment values, the timing adjustment section 10 selects well voltage values to be supplied to clock timing adjustment circuits CTA1 to CTA3 (S3). The clock timing adjustment circuits CTA1 to CTA3 (see FIG. 1) are described later.

According to the foregoing procedure, the present timing adjustment system adjusts a clock timing in each circuit block in the LSI 1. Specifically, the present timing adjustment system compensates an operating frequency of one circuit block with an operating frequency of another circuit block. The one circuit block is a circuit block whose operating frequency is lower than an average value of operating frequencies. The another circuit block is a circuit block whose operating frequency is higher than the average value of operating frequencies. In this way, operating frequencies of the circuit blocks are averaged. As a result, the operating frequency of the LSI 1 as a whole is optimized.

Figure 1:
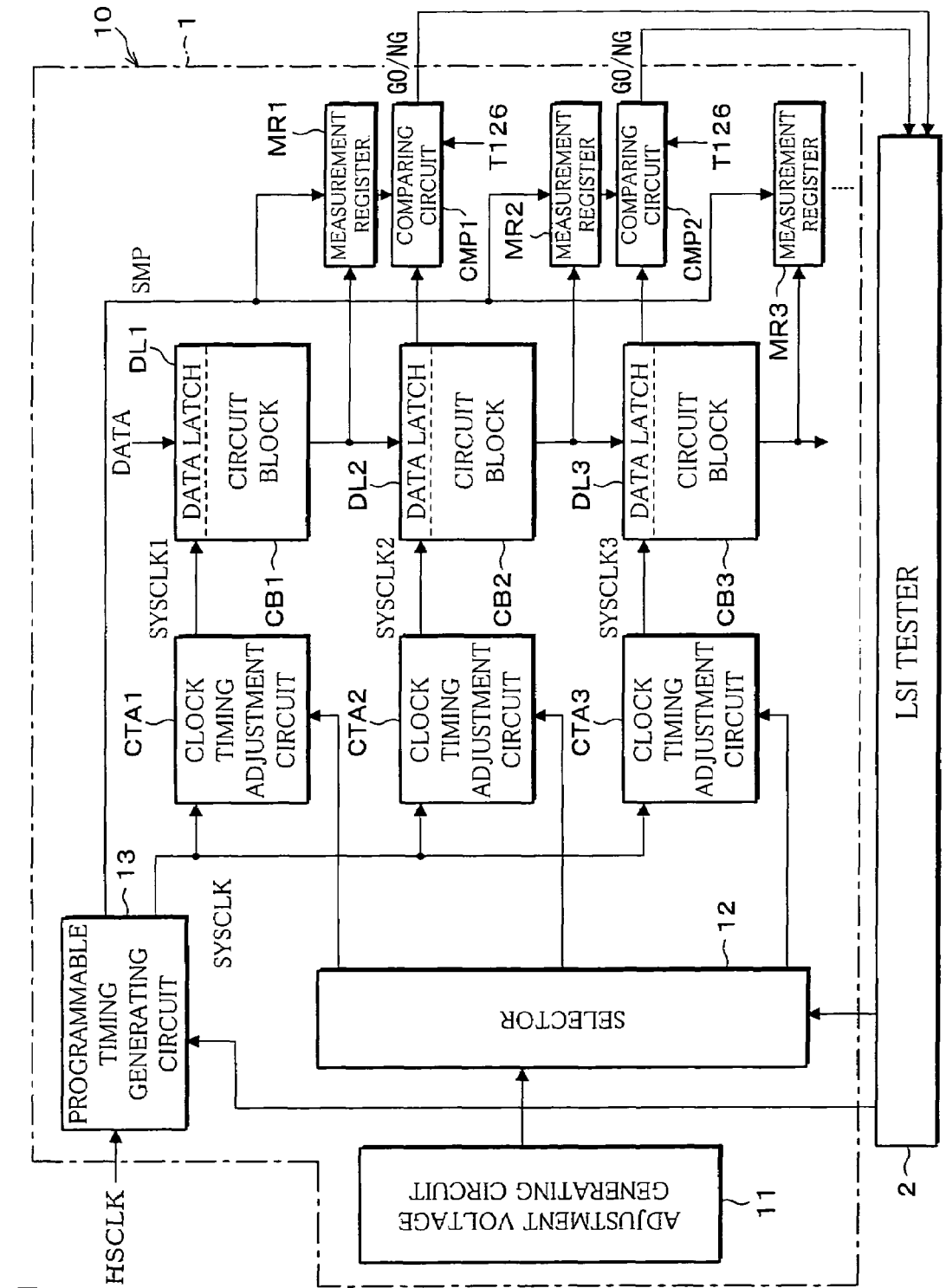
FIG. 1 is a block diagram illustrating, in detail, an arrangement of a timing adjustment section in a timing adjustment system of the present invention, the timing adjustment section being contained in an LSI.

FIG. 1 illustrates an arrangement of the timing adjustment section 10 of the present timing adjustment system, the timing adjustment section 10 being contained in the LSI 1.

As shown in FIG. 1, the timing adjustment section 10 includes an adjustment voltage generating circuit 11, a selector 12, a programmable timing generating circuit 13, the clock timing adjustment circuits CTA1 to CTA3, and measurement registers MR1 to MR3. For the purpose of explanation, the number of circuits of the clock timing adjustment circuits CTA1 to CTA3 and the number of circuits of the measurement registers MR1 to MR3 are three. However, the number of circuits is not limited to three, because the number of circuits corresponds to the number of circuit blocks CB1 to CB3.

Note that, when it does not matter which specific circuit is referred to, but it matters which group of circuits the circuit in question belongs to, the clock timing adjustment circuits CTA1 to CTA3, measurement registers MR1 to MR3, comparing circuits CMP1 to CMP3, and the circuit blocks CB1 to CB3 are referred to as CTA, CMP, and CB, respectively. Also note that, in the following description, the term "circuit block" is often abbreviated as "block", for the purpose of explanation.

The adjustment voltage generating circuit 11 (a voltage adjustment section) is a circuit for generating various voltages necessary for the timing adjustment. In accordance with the well voltage adjustment values (a delay time adjustment amount) supplied from the LSI tester 2, the selector 12 (a voltage selecting section) selects well voltages from the various voltages generated by the adjustment voltage generating circuit 11, and supplies the well voltages to the clock timing adjustment circuits CTA1 to CTA3. The clock timing adjustment circuits CTA1 to CTA3 (a delay-adjustment section) are circuits for performing, by using the well voltages supplied from the selector 12, the timing adjustment of clocks supplied to the circuit blocks CB1 to CB3.

The programmable timing generating circuit 13 is a circuit for generating a system clock SYSCLK and a sampling pulse SMP in accordance with a high-speed clock HSCLK generated by a PLL or the like. The system clock SYSCLK is supplied to the clock timing adjustment circuits CTA1 to CTA3, and the sampling pulse SMP is supplied to the measurement registers MR1 to MR3. The measurement registers MR1 to MR3 (a delay measurement section) perform measurement of delay time. The delay time is time required for actual data processing, i.e. time between an input to and an output from the circuit blocks CB1 to CB3. The measurement registers MR1 to MR3 supply the delay time as timing information to the LSI tester 2.

The following more specifically describes the circuits shown in FIG. 1.

FIGS. 4(a) and 4(b) illustrate one example of an arrangement of the clock timing adjustment circuits CTA1 to CTA3. FIG. 4(a) illustrates an arrangement of a clock timing adjustment circuit CTA as a common arrangement of the clock timing adjustment circuits CTA1 to CTA3.

As shown in FIG. 4(a), the clock timing adjustment circuit CTA is a circuit that reverses an input voltage VIN so as to obtain an output voltage VOUT. The output voltage VOUT is supplied to an electrostatic stray capacitor C, which is a load (the circuit blocks CB1 to CB3). The clock timing adjustment circuit CTA includes five-stage inverters 31 to 35. Among the five-stage inverters 31 to 35, the inverters 32 and 33 constitute an adjustment section 30.

Figure 5:
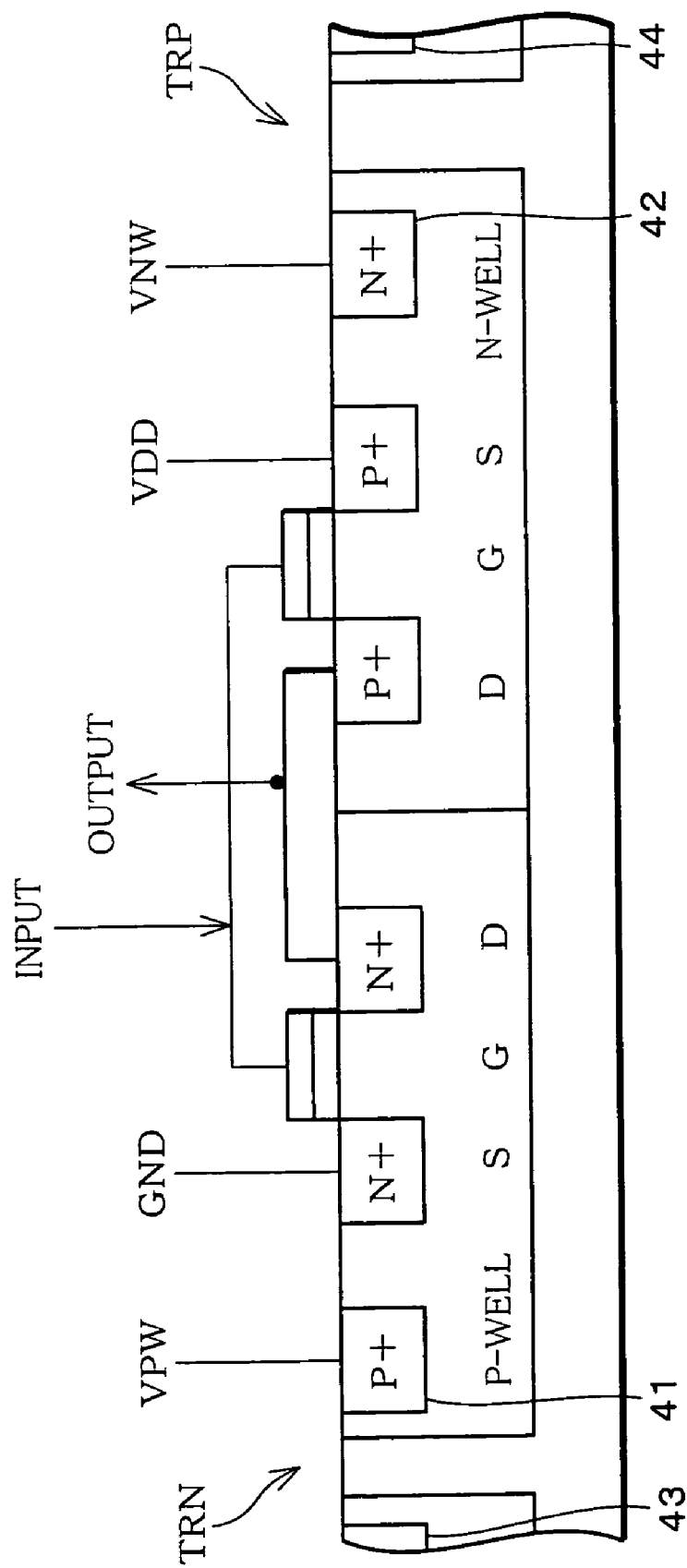
FIG. 5 is a cross-sectional view illustrating a device structure of a main part of the clock timing adjustment circuit.

FIG. 5 is a cross-sectional view illustrating a device arrangement of a main part (the adjustment section 30) of the clock timing adjustment circuit CTA.

As shown in FIG. 4(b) and FIG. 5, the inverters 31 and 32 are arranged in a CMOS arrangement in which NMOS transistors TRN and PMOS transistors TRP are serially connected. To a P-well 41 of the NMOS transistors TRN, a voltage VPW of the P-well is applied. To an N-well 42 of the PMOS transistors TRP, a voltage VNW of the N-well is applied.

The P-well 41 of the NMOS transistors TRN and the N-well 42 of the PMOS transistors TRP are integrally formed, but are separated from a well 43 and a well 44 of other circuits provided to the same substrate on which the P-well 41 and the N-well 42 are provided. Therefore, it is possible to apply, independently from the other circuits, the voltage VPW of the P-well to the P-well 41 and the voltage VNW of the N-well to the N-well 42. Timing properties of the NMOS transistors TRN and the PMOS transistors TRP are changed in accordance with values of the voltage VPW of the P-well and the voltage VNW of the N-well.

Here, the voltage VNW of the N-well and the voltage VPW of the P-well, and delay properties of the inverters 32 and 33 are described.

Usually, a potential at a GND-level is supplied to the P-well of the NMOS transistors in the CMOS inverter. However, when a positive voltage is applied to the P-well, a threshold voltage decreases, and therefore the delay time of the CMOS inverter decreases. On the other hand, when a negative voltage is applied to the P-well, the threshold voltage increases, and therefore the delay time of the CMOS inverter increases. Usually, a potential at a VDD (line voltage)-level is supplied to the N-well of the PMOS transistors of the CMOS inverter. However, when a negative voltage is applied to the N-well, an absolute value of the threshold voltage decreases, and therefore the delay time of the CMOS inverter decreases. On the other hand, when a positive voltage is applied to the N-well, the absolute value of the threshold voltage increases, and therefore the delay time of the CMOS inverter increases. Such a phenomenon occurs because an operating speed of the transistors changes when a current value changes in accordance with a change to the threshold voltage. The well voltage and the delay time are substantially proportional.

In recent LSIs, the line voltage is drastically decreased due to an increasingly superfine process. This means that the threshold voltage makes up a large proportion of the line voltage. Therefore, when the threshold voltage is changed, the delay property of transistors is also changed significantly.

Figure 6:
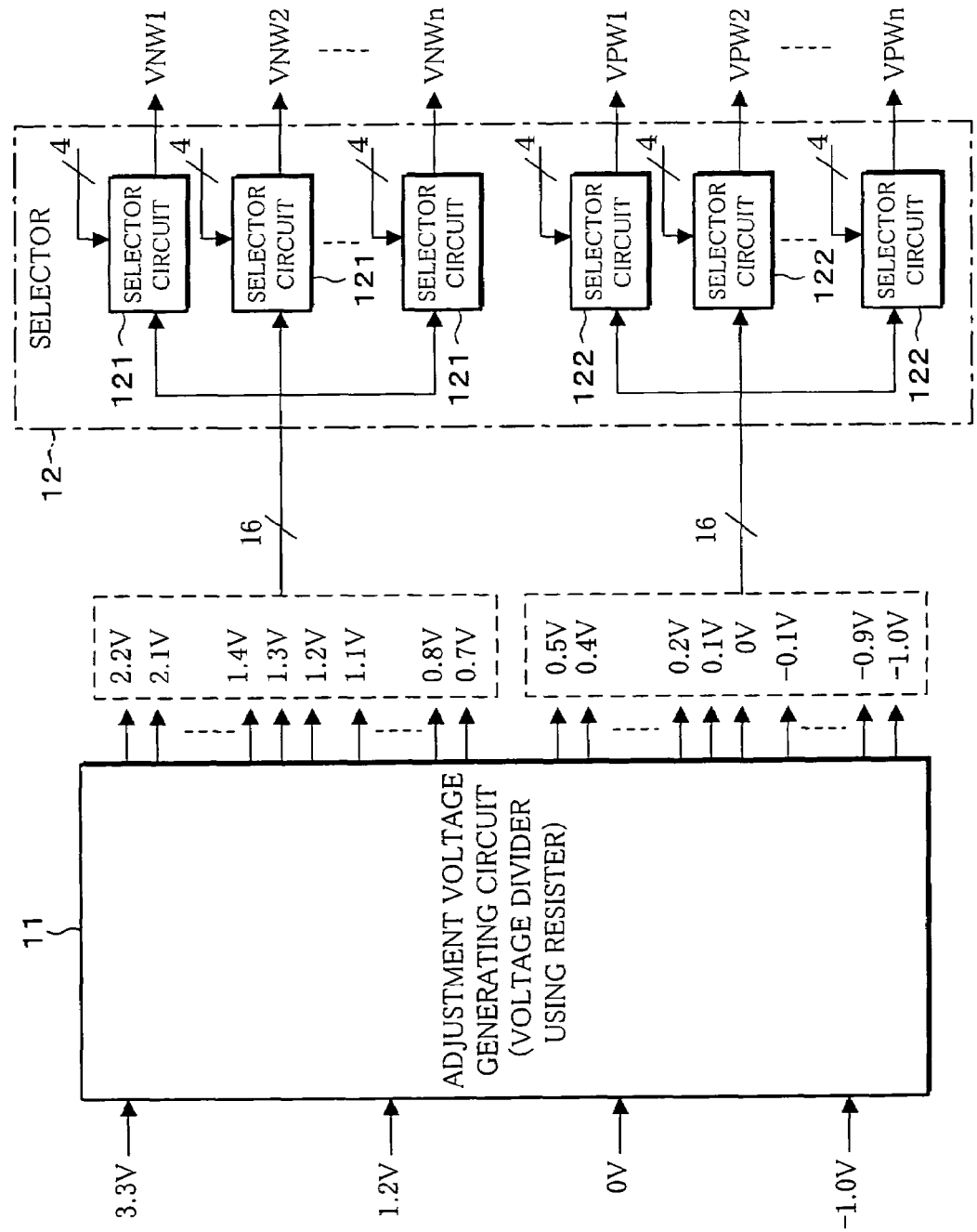
FIG. 6 is a block diagram illustrating arrangements of an adjustment voltage generating circuit and a selector, both of which belong to the timing adjustment section.

FIG. 6 illustrates arrangements of the adjustment voltage generating circuit 11 and the selector 12.

As shown in FIG. 6, the adjustment voltage generating circuit 11 includes a divisional resistor circuit. The adjustment voltage generating circuit 11 receives input voltages of −1.0V, 0V, 1.2V, and 3.3V, and generates 32 adjustment voltages that are different from one another by 0.1V within a range of −1.0V to 2.2V. Specifically, the adjustment voltage generating circuit 11 generates (i) the adjustment voltages within a range of −1.0V to 0V in accordance with the input voltages of −1.0V and 0V, (ii) the adjustment voltages within a range of 0.1V to 1.2V in accordance with the input voltages of 0V and 1.2V, and (iii) the adjustment voltages within a range of 1.3V to 2.2V in accordance with the input voltages of 0V and 3.3V. The divisional resistor circuit of the adjustment voltage generating circuit 11 can be made of polysilicon or the like by an LSI process. The divisional resistor circuit can easily generate voltages with high accuracy.

In the foregoing example, an internal-circuit-use line voltage of the LSI 1 is 1.2V, and an I/O-use line voltage of the LSI 1 is 3.3V. The internal-circuit-use line voltage and the I/O-use line voltage are used as the input voltages to the adjustment voltage generating circuit 11. A negative power source for generating the voltage of −1.0V can be constituted easily by a bootstrap circuit that uses a switched capacitor technique.

The selector 12 (the voltage selecting section) selects one of the adjustment voltages generated by the adjustment voltage generating circuit 11. By so doing, the selector 12 supplies the voltage VNW of the N-well and the voltage VPW of the P-well to the clock timing adjustment circuit CTA. For this purpose, the selector 12 includes n-number of selector circuits 121 and n-number of selector circuit 122. Each selector circuit 121 selects one of the 16 adjustment voltages within a range of 0.7V to 2.2V in accordance with a four-bit well voltage adjustment value supplied from the LSI tester 2. Then, the selector circuit 121 outputs the one of the 16 adjustment voltages as the N-well voltage VNW (one of VNW1 to VNWn). On the other hand, each selector circuit 122 selects one of the 16 adjustment voltages within a range of −1.0V to 0.5V in accordance with the four-bit well voltage adjustment value supplied from the LSI tester 2. Then, the selector circuit 122 outputs the one of the 16 adjustment voltages as the voltage VPW of the P-well (one of VPW1 to VPWn). Here, n is the number of the clock timing adjustment circuit CTA (the number of the circuit blocks CB). In FIG. 1, n=3.

Figure 7:
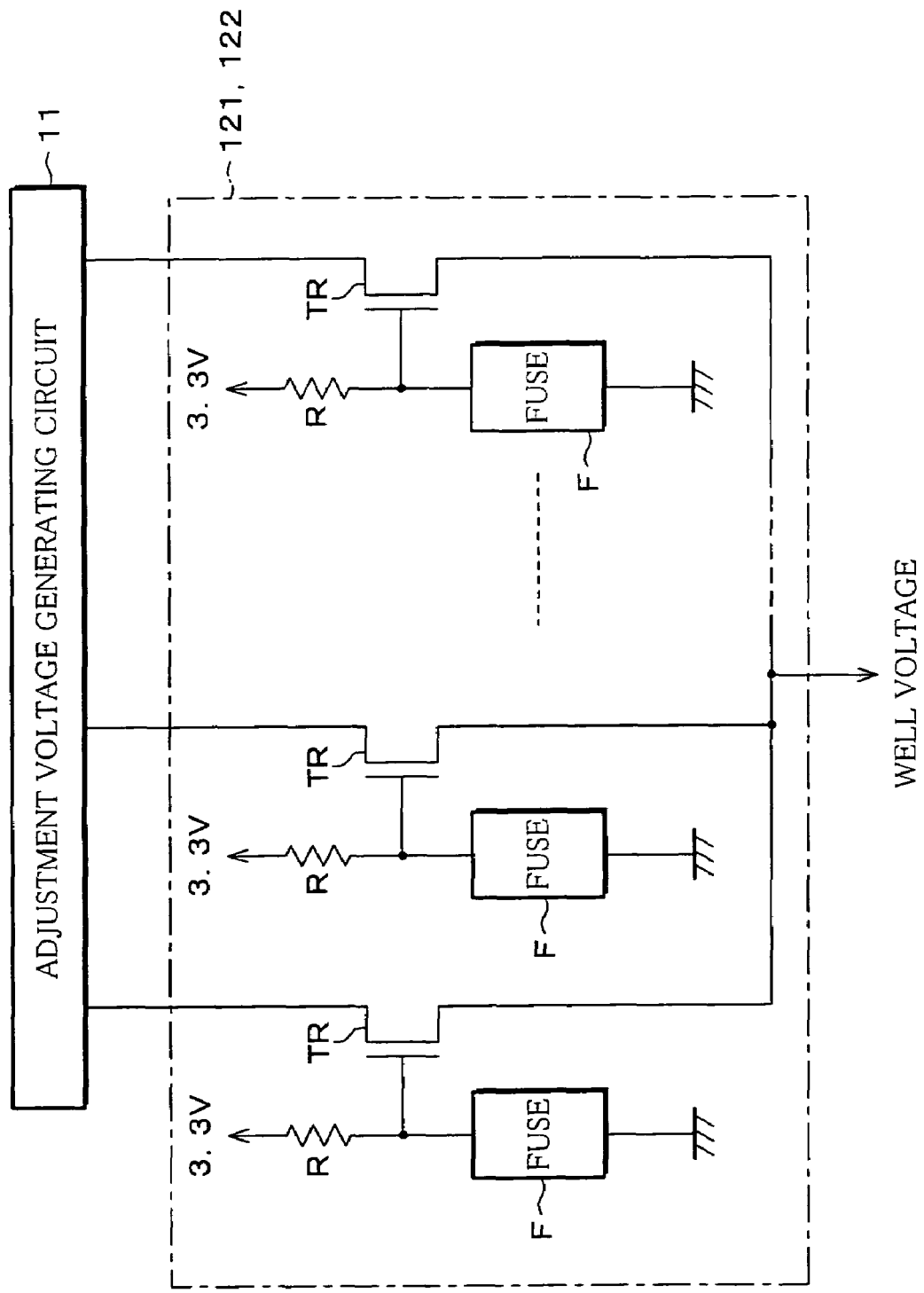
FIG. 7 is a circuit diagram illustrating an arrangement of a selector circuit of the selector.

FIG. 7 is a circuit diagram illustrating arrangements of the selector circuits 121 and 122.

As shown in FIG. 7, each of the selector circuits 121 and 122 includes plural sets of (i) a transistor TR, (ii) a resistor R, and (iii) a fuse F. The fuse F of each set constitutes a fixing section. The number of the plural sets is identical to the number (16, in the foregoing example) of the adjustment voltages supplied from the adjustment voltage generating circuit 11. In each set, the transistor TR receives one of the adjustment voltages at an input terminal of the transistor TR, and a gate of the transistor TR is connected to one end of the resistor R and one end of the fuse F. The other end of the resistor R is connected to a constant voltage (for example, a 3.3V-voltage). The other end of the fuse F is connected to a GND-level potential.

In each of the selector circuits 121 and 122 having the foregoing arrangement, the fuse F of one of the plural sets is cut off in accordance with a finally determined well voltage adjustment value before a shipment of the LSI 1. In this way, the gate of the transistor TR connected to the fuse F of one of the plural sets becomes HIGH. On the other hand, the gate of the transistor TR connected to the fuse F that is not cut off becomes LOW. By thus cutting the fuse F off, the well voltage adjustment value is programmed. Therefore, the well voltage adjustment value is kept after the shipment of the LSI 1.

Because the voltages are applied to the wells only for keeping a well potential, a high capacity for supplying a current to the wells is not required. Therefore, it is not necessary to provide a buffer circuit and the like. As a result, it is possible to attain a small circuit size.

The voltage selecting section is not limited to the selector 12 having the foregoing arrangement. For example, the voltage selecting section may be a circuit that receives the well voltage adjustment value in a form of a continually changing frequency, and changes the frequency into a voltage. With such a voltage selecting section, it is possible to continually adjust the clock timing.

Figure 8:
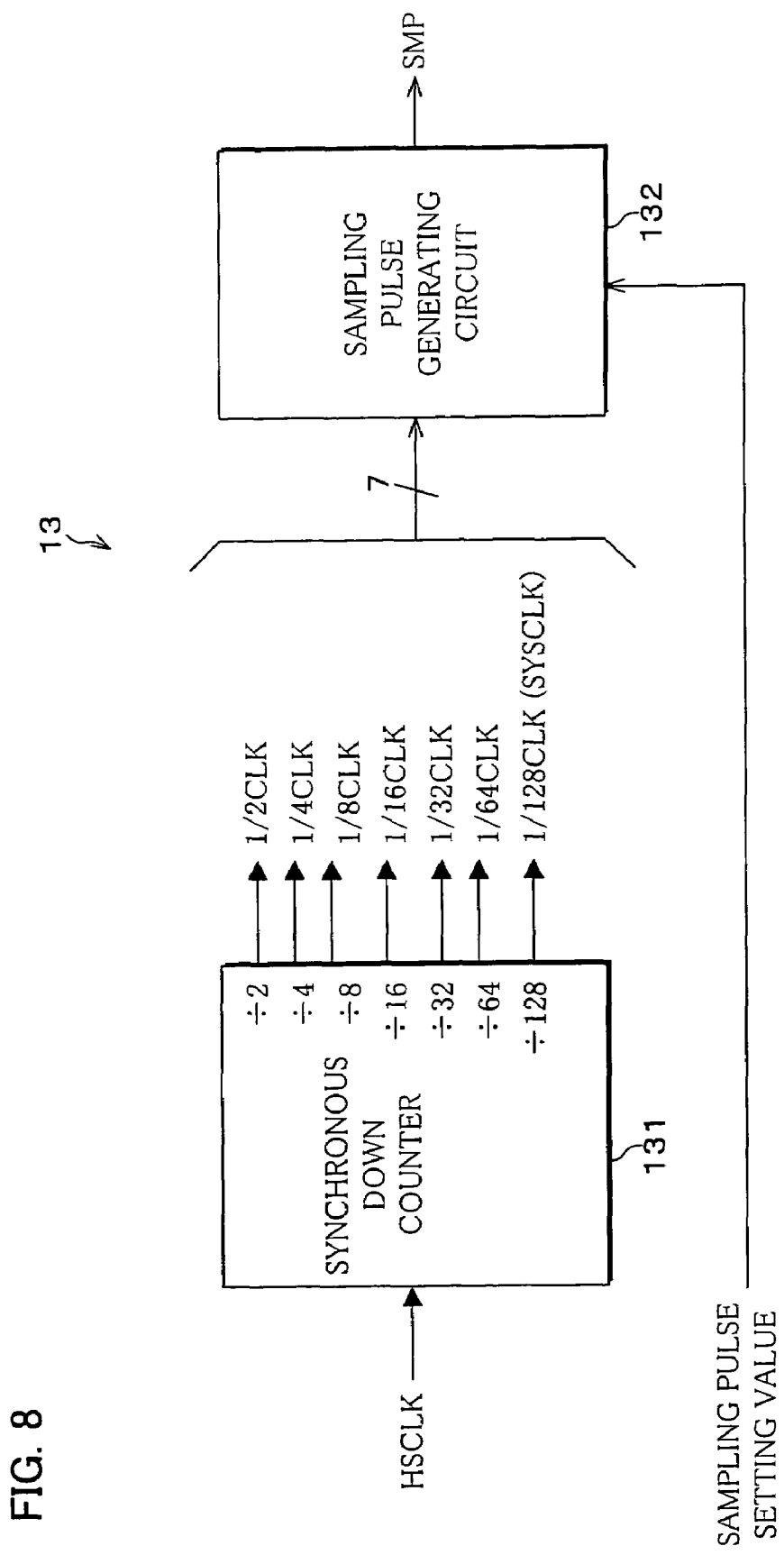
FIG. 8 is a block diagram illustrating an arrangement of a programmable timing generating circuit of the timing adjustment section.
Figure 9:
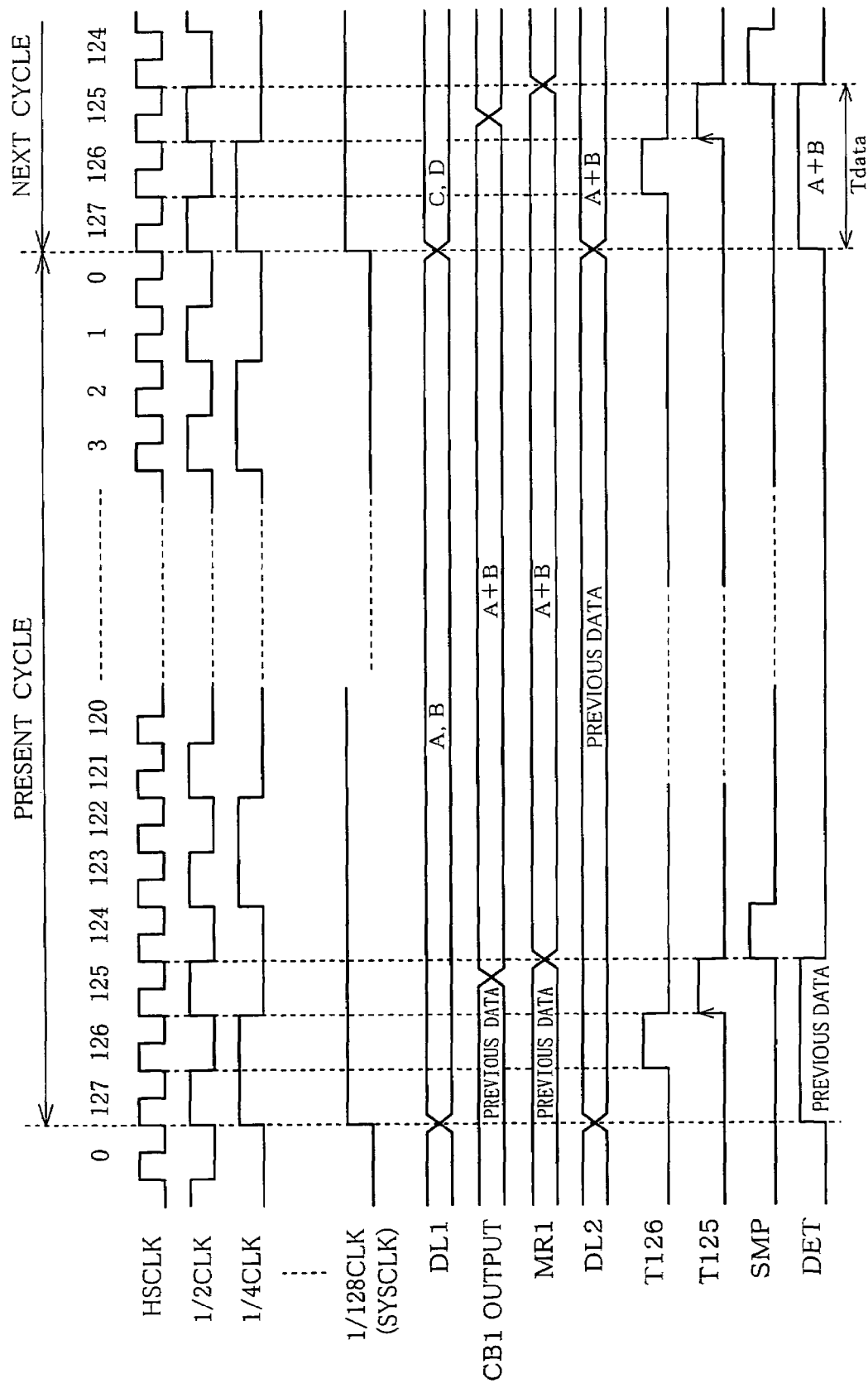
FIG. 9 is a time chart illustrating operation of various parts of the timing adjustment section when delay time in each circuit block is measured from various clocks generated by the programmable timing generating circuit.
Figure 10:
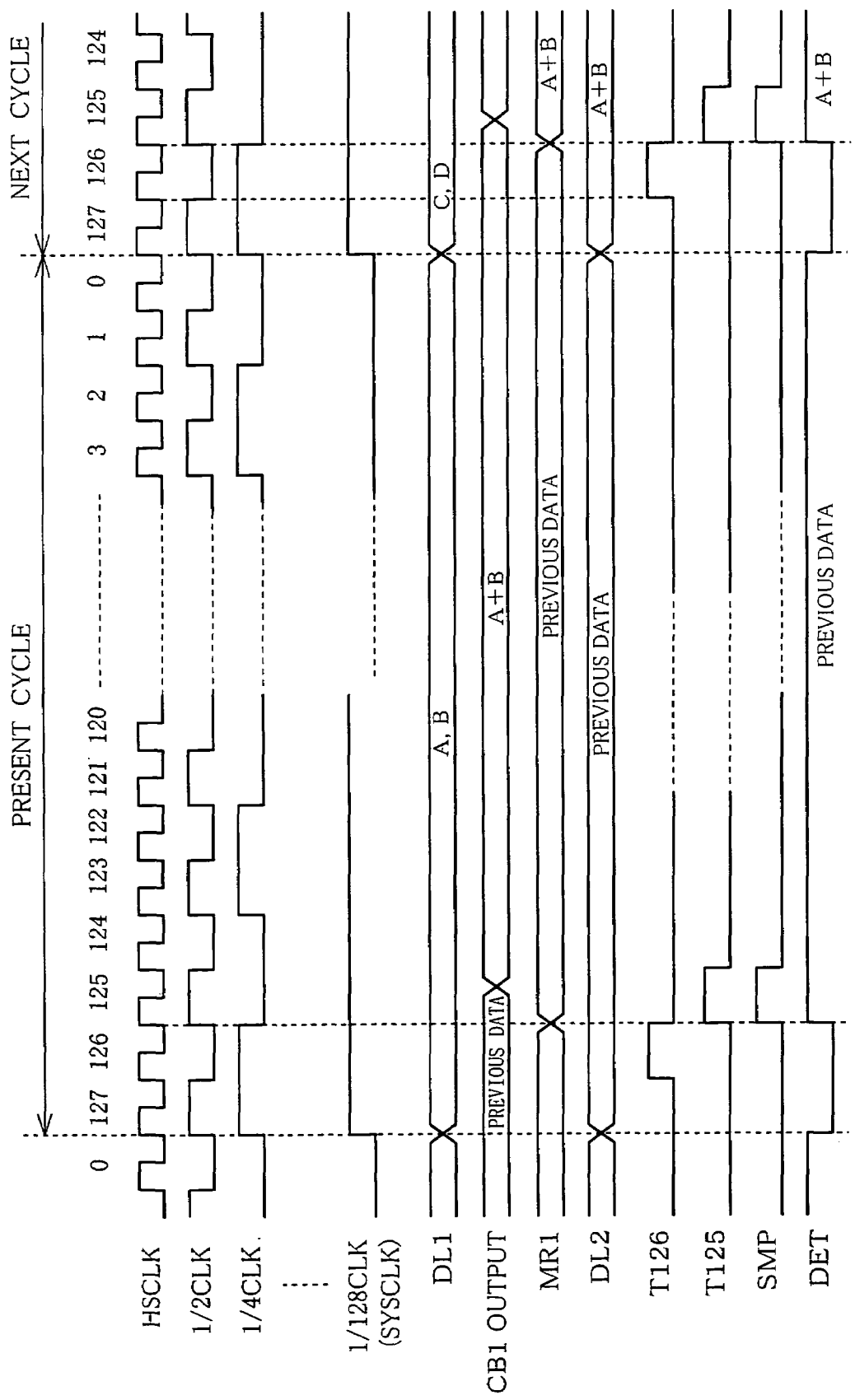
FIG. 10 a time chart illustrating other operation of various parts of the timing adjustment section when delay time in each circuit block is measured from various clocks generated by the programmable timing generating circuit.

FIG. 8 illustrates an arrangement of the programmable timing generating circuit 13. FIGS. 9 and 10 illustrate operating timings of the timing adjustment section 10 during the measurement of the delay time.

As shown in FIG. 8, the programmable timing generating circuit 13 includes a synchronous down counter 131 and the sampling pulse generating circuit 132.

The synchronous down counter 131 divides the high-speed clock HSCLK into two, four, eight, 16, 32, 64, and 128, and outputs divided clocks shown in FIG. 9 (½CLK, ¼CLK, ⅛CLK, ¹⁄₁₆CLK, ¹⁄₃₂CLK, ¹⁄₆₄CLK, and ¹⁄₁₂₈CLK). The high-speed clock HSCLK is supplied from the PLL circuit or the like provided in the LSI 1. The seven divided clocks are supplied to the sampling pulse generating circuit 132.

The sampling pulse generating circuit 132 (a pulse generating section) is a circuit that generates the sampling pulse SMP from the divided clocks supplied from the synchronous down counter 131. The sampling pulse generating circuit 132 generates the sampling pulse SMP at timings T125 to T0 (described later; see FIG. 9) in accordance with the sampling pulse setting value supplied from the adjustment control section 23 of the LSI tester 2. A pulse width of the sampling pulse SMP is one period of the high-speed clock HSCLK. The sampling pulse generating circuit 132 performs such operation as to generate plural sets of the sampling pulse SMP, and select one of the plural sets. The sampling pulse generating circuit 132 is made by appropriately combining logical circuits, for example.

The measurement registers MR1 to MR3 are registers for acquiring and holding, at a timing of a rise of the sampling pulse SMP, data processed by the circuit blocks CB1 to CB3.

The comparing circuit CMP1 compares two sets of data, i.e. the data held by the measurement register MR1 and the data acquired by a data latch DL2 of the circuit block CB2, and notifies the LSI tester 2 whether the two sets of data match (GO) or mismatch (NG). A comparing circuit CMPn, where n is an integer, compares data held in a measurement register MRn and data acquired by a data latch DLn+1 of a circuit block CBn+1, which is a next circuit block of the circuit block CBn+1. The comparing circuit CMPn then notifies the result to the LSI tester 2. The comparing circuit CMP compares two sets of data at a timing of T126 shown in FIG. 9. For example, an output of the comparing circuit CMP is HIGH if the result is that the two sets of data match, and the output of the comparing circuit CMP is LOW if the result is that the two sets of data mismatch.

Here, delay-time measurement operation of the timing adjustment section 10 having the foregoing arrangement is described, with reference to FIGS. 9 and 10. In FIGS. 9 and 10, the delay-time measurement operation of a case in which the circuit blocks perform addition is illustrated.

Measurement of all the circuit blocks CB is performed as a pre-stage of a delay-time adjustment. Therefore, a clock timing adjustment is not performed in the delay-time measurement. At a stage of the delay-time measurement, the system clock SYSCLK, which controls an operational timing, is set to a low speed so as to make sure that the circuit as a whole operates.

In order to provide a specific description, the following describes the circuit block CB1 as a circuit block that performs addition of a value A and a value B.

As shown in FIG. 9, each cycle (one period of the system clock SYSCLK) is in synchronization with the system clock SYSCLK, and the input data (data A and B) shown in FIG. 1 is acquired by a data latch DL1 in synchronization with the system clock SYSCLK. The data A and the data B are added by the circuit block CB1, and an added value (A+B) is outputted (an output of the circuit block CB1).

However, because the delay time of the first circuit block CB1 is unknown, it is unknown at what timing (the sampling pulse SMP) the data should be acquired by the measurement register MR1.

The data of the added value (A+B) supplied from the circuit block CB1 is acquired by the data latch DL2 at a beginning of a next cycle. Because the period of the system clock SYSCLK is sufficiently long, the data latch D2 always acquires correct data.

For example, if the data is acquired by the measurement register MR1 at T124 (the same timing as the sampling pulse SMP) as shown in FIG. 9, there is a time period in which the data held by the measurement register MR1 matches the data acquired by the data latch DL2, the time period being at the beginning of the next cycle. Therefore, if the data held by the measurement register MR1 and the data acquired by the data latch DL2 are sampled and held in the time period at a first comparison timing (T126) in one cycle by using the comparing circuit CMP, a matching detection pulse DET is outputted. As a result, it is found that the data held by the measurement register MR1 matches the data acquired by the data latch DL2, i.e. that the measurement register MR1 acquired correct data. The result is notified to the LSI tester 2.

Note that the first comparison timing is set to T126 because, at T127, the data has just been received by the data latch DL, and is therefore unstable.

Described next is how a timing for the measurement register MR to acquire correct data is determined by the timing adjustment section 10.

First, as shown in FIG. 10, the programmable timing generating circuit 13 supplies T125 as the sampling pulse SMP. In the present cycle, the data supplied from the circuit block CB1 is acquired at a timing of a rise of T125 (the sampling pulse SMP). At this time, the measurement register MR1 has previous data outputted before the added value (A+B) was outputted. The previous data is held for one cycle, that is, until the rise of T125 in a next cycle.

On the other hand, the data latch DL2 receives A+B, which is a correct result of a calculation performed by the circuit block CB1. Therefore, the two sets of data, i.e. the data acquired by the data latch DL2 and the data held by the measurement register MR1, are compared at T126 in a next cycle, and it is judged that the two sets of data mismatch. Upon receiving the result that the two sets of data mismatch, the adjustment control section 23 gives to the sampling pulse generating circuit 132 an instruction for delaying the sampling pulse SMP by one clock of the high-speed clock HSCLK.

Upon receiving the instruction, the sampling pulse generating circuit 132 outputs T124 as the sampling pulse SMP. Then, as shown in FIG. 9, the measurement register MR1 acquires the correct added value (A+B) from the circuit block CB1. Therefore, when the two sets of data, i.e. the data acquired by the data latch DL2 and the data held by the measurement register MR1, are compared in T126 in the next cycle, it is judged that the two sets of data match. In this way, at an earliest timing for the measurement register MR1 to acquire the data supplied from the circuit block CB1, it is detected that the two sets of data match. Thus, it is possible to detect correct delay time.

By using the adjustment control section 23, the LSI tester 2 can recognize a time period of Tdata of a matching detection pulse DET as delay time. Because the LSI tester 2 has information on which sampling pulse SMP is currently used as a timing for a test that is being performed, and on various clocks supplied from the synchronous down counter 131, it is easy to find the delay time from (i) the timing of the sampling pulse SMP used as the timing for the test that is being performed and (ii) a timing of the various clocks.

There are cases in which the measurement register MR acquires correct data from an initial sampling pulse SMP. However, it is unknown which timing the correct data is acquired. Therefore, in such cases, the adjustment control section 23 gives to the sampling clock generating circuit 132 an instruction for forwarding the sampling pulse SMP by one clock of the high-speed clock HSCLK. This operation is repeated until the comparing circuit CMP outputs a result that the two sets of data match. In this way, the delay time is calculated at an earliest timing.

Thus, in measuring the delay time, the data held by the measurement register MR and the data acquired by the data latch DL of a next circuit block at the system clock SYSCLK, whose period is much longer than that of the sampling pulse SMP, are compared while the sampling pulse SMP is shifted by one clock at a time, the one clock being that of the high-speed clock HSCLK. With this arrangement, the delay time can be measured with high accuracy in accordance with a timing of the high-speed clock HSCLK.

On an assumption that, at minimum, delay time of every circuit block CB is equivalent to several clocks of the high speed clock HSCLK, if generation of the sampling pulse SMP is started from T125, initially it is judged with respect to every circuit block CB that the two sets of data mismatch, as shown in FIG. 10. Therefore, it is possible to compare the two sets of data by sequentially delaying the timing from T125 to T124, from T124 to T123, . . . and the like. In this way, it is possible to avoid judging from the initial sampling pulse SMP that the two sets of data match. As a result, a sequence of the measurement is simplified.

As described above, timings for generating the sampling pulse SMP are T125 to T0. However, for the reasons below, T126 cannot be used. If data is acquired at the timing of T126, the data is held until T126 of a next cycle. Meanwhile, a match/mismatch test performed by the comparing circuit CMP is performed at the timing of T126. Therefore, the data held by the measurement register MR at a fall of T126 becomes unstable.

Thus, the timing adjustment section 10 measures the delay time with respect to each circuit block CB. Therefore, it is possible to collect basic data for an inter-block timing adjustment, which is described later.

Although the timing adjustment section 10 is contained in the LSI 1, the timing adjustment section 10 may be provided as an external device that is independent from the LSI 1. However, if the timing adjustment section 10 is provided as an external device, there is a possibility that a stray capacitance caused by an LSI package and a measurement system affects transfer of information from the LSI 1 to the external device. In contrast, if the timing adjustment section 10 is contained in the LSI 1, it is possible to measure the delay time in each circuit block CB accurately, without being affected by the measurement system and the like.

Next, processing performed by the average value calculating section 21, the well voltage value setting section 22, and the adjustment control section 23, all of which are provided in the LSI tester 2, are described.

Figure 11:
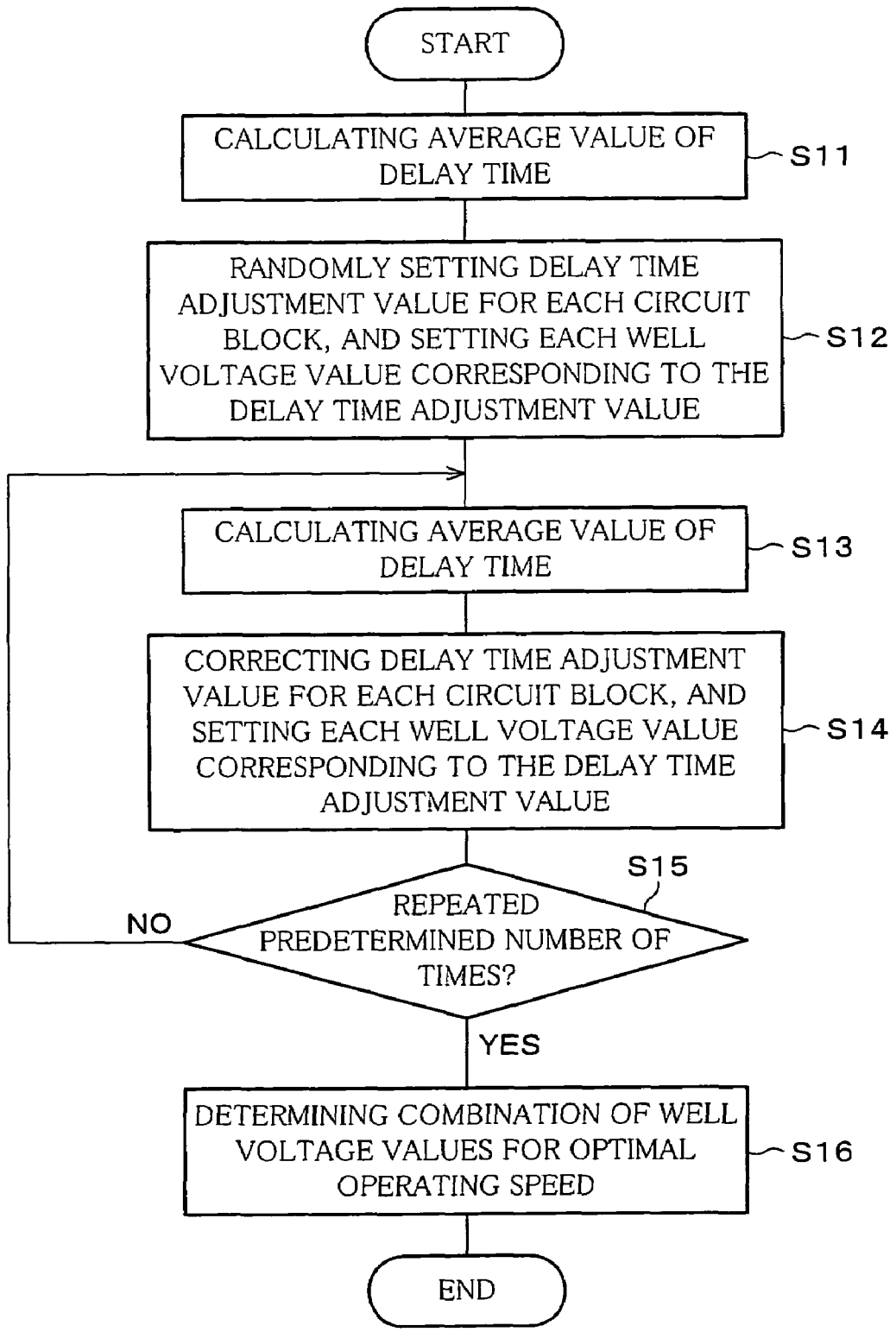
FIG. 11 is a flowchart illustrating steps of a timing adjustment performed by an LSI tester of the timing adjustment system.

FIG. 11 is a flowchart illustrating steps of the processing performed by an adjustment program, i.e. the average value calculating section 21, the well voltage value setting section 22, and the adjustment control section 23.

First, the average value calculating section 21 calculates (i) an average value of the delay time of each circuit block, the delay time being obtained as an indication of a desired value to be attained by the adjustment, and (ii) a deviation of the delay time (S11). Next, the well voltage value setting section 22 sets, with certain randomness, a delay-time adjustment value of each circuit block so that the delay time of each circuit block becomes closer to the average value, and sets a well voltage value corresponding to the delay-time adjustment value (S12).

In the LSI 1, when well voltage adjustment values that are in accordance with the well voltage values set as described above are supplied from the well voltage value setting section 22, the clock timing adjustment circuits CTA1 to CTA3 perform a clock timing adjustment in accordance with the well voltage adjustment values. Subsequently, the average value calculating section 21 again calculates the average value and the deviation from the delay time of each of the circuit blocks CB1 to CB3 (S13). Then, the well voltage value setting section 22 sets the delay-time adjustment values to such values (i) that cause the delay time of each of the circuit blocks CB1 to CB3 to be closer to the average value, but (ii) that are different from previous values, and sets well voltage values corresponding to the delay-time adjustment values (S14).

Thereafter, the adjustment control section 23 confirms how many times S14 to S16 have been repeated (S15). As a result of processing repeated a predetermined number of times, a combination of well voltage values is determined, the combination optimizing an operating speed of each of the circuit blocks CB1 to CB3 (S16).

In the foregoing processing, the optimal well voltage values are unclear when the adjustment is started. Therefore, at the beginning, the delay time is adjusted randomly. The delay-time adjustment value is set by a method such as a genetic algorithm. From this time onward, the delay time adjustment is performed by setting an adjustment value that is different from a previous value. A new adjustment value is set in accordance with the delay time of each of the circuit blocks CB1 to CB3, the delay time corresponding to a previous adjustment value. By changing the adjustment value in this way, that is, by repeating the same operation plural times even if a desired result is not attained immediately, the optimal well voltage adjustment values finally obtained are programmed to the LSI 1.

If, for example, the delay time of the circuit block CB1 is 60 ns, (16.7 MHz) and the delay time of the circuit block CB2 is 40 ns, the average value (calculated by the average value calculating section 21) of the delay time is 50 ns (20 MHz), and the deviation of the delay time is 10 ns. Ideally, the well voltage value setting section 22 subtracts the 10 ns-deviation as a delay-time adjustment value from the delay time of the circuit block CB1, and adds the 10 ns-deviation to the delay time of the circuit block CB2.

Figure 12:
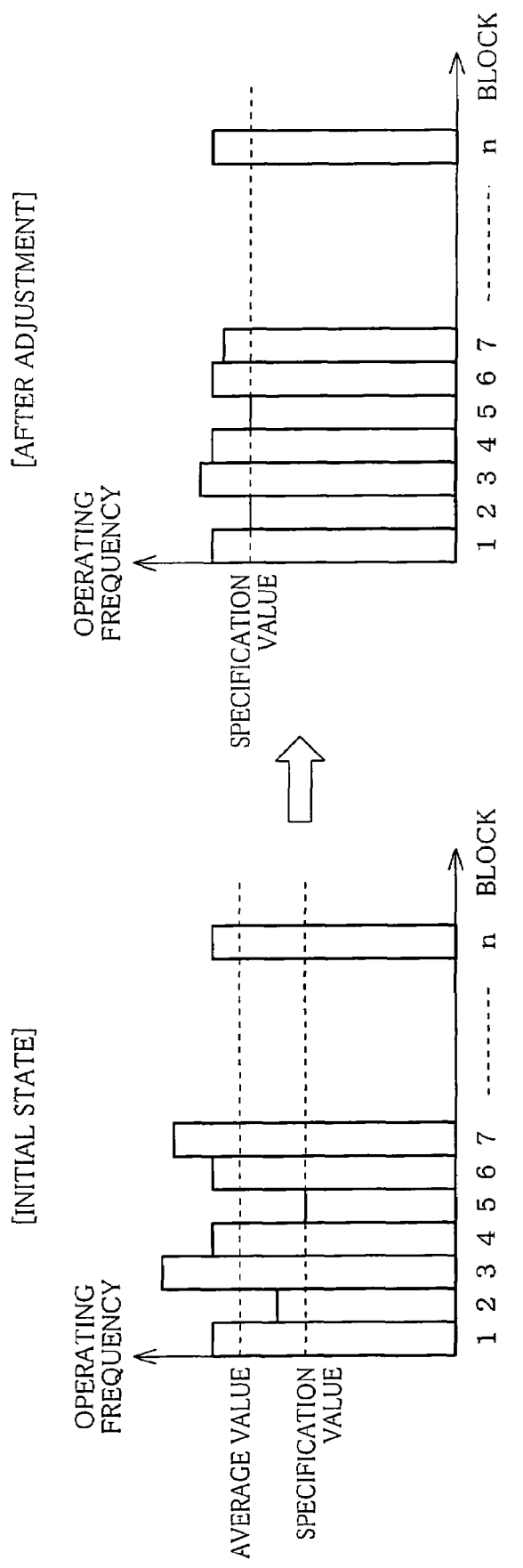
FIG. 12 is a graph illustrating an operating frequency of each block of the LSI before and after the delay time is adjusted.

FIG. 12 illustrates a comparison of operating frequencies before and after delay time of n-number of blocks of a trial product LSI is adjusted as described above.

As shown in FIG. 12, in an initial state, the delay time of each block is significantly different from one another. Therefore, even if an average value of an operating frequency of each block is high, a fifth block, which operates at a lowest speed (whose delay time is the longest), determines the operating frequency (a specification value) of the LSI. In the foregoing processing, the delay time is borrowed (adjusted) between (i) a block that operates at a high speed and (ii) a block that operates at a low speed. As a result, the operating frequency of the fifth block is increased to a value close to the average value. Therefore, the operating frequency (a specification value) of the LSI is also increased from the value before the adjustment is performed. In collecting the delay time, the adjustment control section 23 also collects the operating frequency of each block of the LSI 1, so as to confirm (evaluate) whether or not the operating frequency has been maximized.

In the processing performed by the adjustment program, the adjustment of the well voltage values is repeated, the adjustment being performed so as to optimize allocation of the delay time in accordance with the delay time measured. However, it is not always necessary for the present timing adjustment system to repeat, as described above, the processing that starts with the calculation of the average value and ends with the adjustment of the well voltage values, as long as the operating frequency is increased by adjusting the well voltage value in accordance with the delay time.

For example, the present timing adjustment system may be arranged as follows: (1) Data specifying which blocks are targets of delay-time borrowing is prepared in advance, and (2) The average value of the delay time and the deviation of the delay time are plugged into the data. In this case, a relationship between an amount of borrowing of the delay time and the values are stored in a table, and the well voltage values that correspond to the amount of borrowing of the delay time, the amount of borrowing being determined in accordance with the average value and the deviation, are read out of the table. Such processing is performed by the well voltage value setting section 22, for example.

Next, a specific example of the timing adjustment performed by the timing adjustment system having the foregoing arrangement is described.

Figure 13:
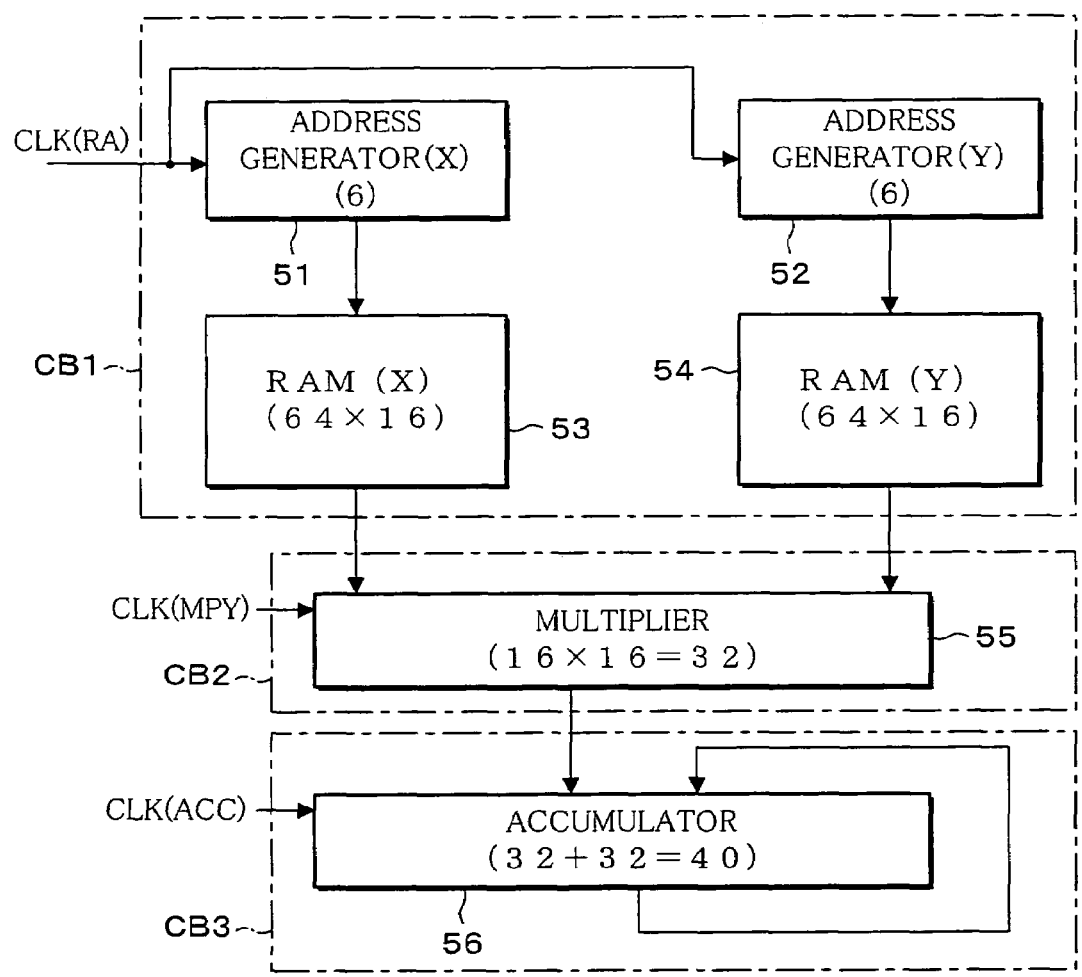
FIG. 13 is a block diagram illustrating an arrangement of a sum-and-product calculator, which is a target of a delay-time adjustment performed by the timing adjustment system.
Figure 14:
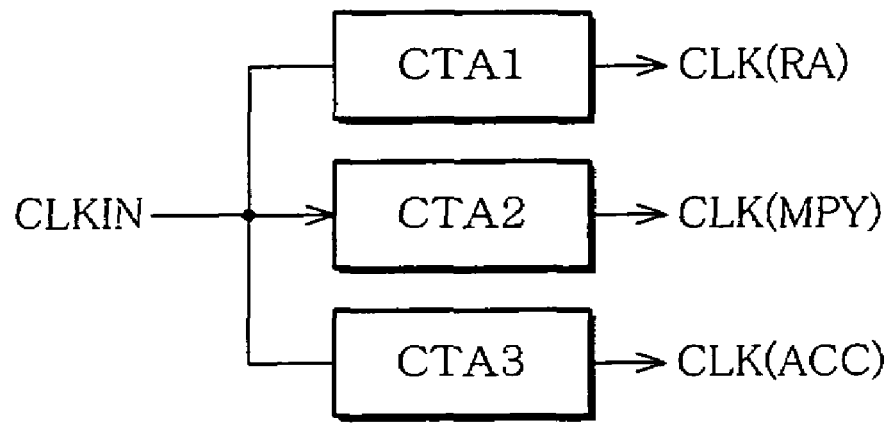
FIG. 14(a) is a block diagram illustrating an arrangement of the clock timing adjustment circuit for adjusting a clock to be supplied to each block of the sum-and-product calculator.
FIG. 14(b) is a time chart illustrating clock-adjustment operation performed by the clock timing adjustment circuit.
Figure 14:
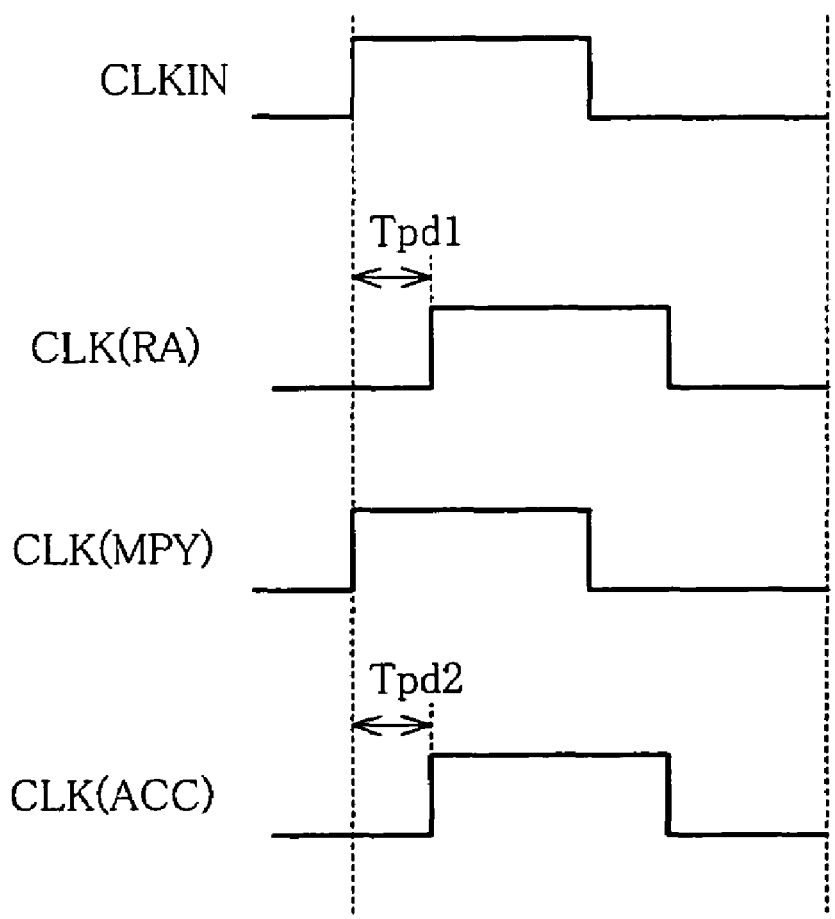
Figure 15:
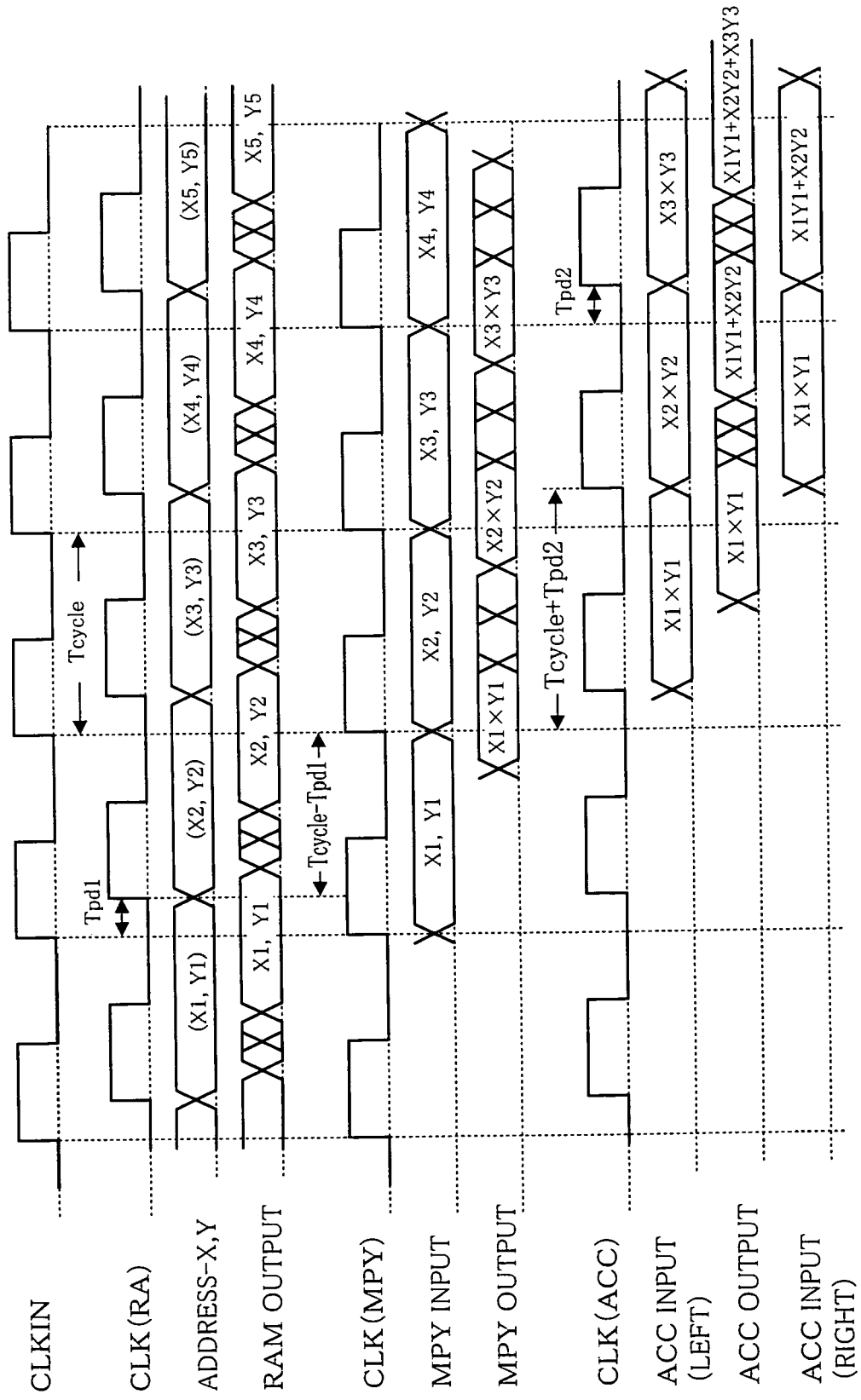
FIG. 15 is a time chart illustrating operation of the sum-and-product calculator.

FIG. 13 illustrates an arrangement that realizes a product-and-sum calculator used in a DSP and the like in order to perform the timing adjustment. FIG. 14(a) illustrates the clock timing adjustment circuits CTA1 to CTA3 for adjusting a clock to be supplied to each block of the product-and-sum calculator. FIG. 14(b) is a time chart illustrating clock adjustment operation performed by the clock timing adjustment circuits CTA1 to CTA3. FIG. 15 is a time chart illustrating operation of the product-and-sum calculator.

As shown in FIG. 13, the product-and-sum calculator includes address generators (ADD) 51 and 52, RAMs 53 and 54, a multiplier (MPY) 55, and an accumulator (ACC) 56. The address generators 51 and 52 generate 6-bit addresses at a timing of a clock CLK (RA). The RAMs 53 and 54 respectively read out two sets of 16-bit data that are respectively in accordance with the addresses generated by the address generators 51 and 52. The multiplier 55 multiplies, at a timing of a clock CLK (MPY), the two sets of data supplied from the RAMs 53 and 54. The accumulator 56 adds, at a timing of a clock CLK (ACC), output data thereof to 32-bit multiplied data supplied from the multiplier 55. The data supplied to the address generators 51 and 52, the multiplier 55, and the accumulator 56 is latched at rises of the clock CLK (RA), the clock CLK (MPY), and the clock CLK (ACC), respectively. Thus, the address generators 51 and 52, the multiplier 55, and the accumulator 56 function as latches.

Here, the following conditions are set for the purpose of explanation: (1) In the product-and-sum calculator, the address generators 51 and 52, and the RAMs 53 and 54 are included in the circuit block CB1, the multiplier 55 is included in the circuit block CB2, and the accumulator 56 is included in the circuit block CB3; (2) Delay time of the multiplier 55 is longer than delay time of the RAMs 53 and 54 and the delay time of the accumulator 56; (3) At a present clock frequency, an operating speed of the multiplier 55 is insufficient.

As shown in FIG. 14(a), the clock timing adjustment circuits CTA1, CTA2, and CTA3 respectively supply the clock CLK (RA) to the address generators 51 and 52, the clock CLK (MPY) to the multiplier 55, and the clock CLK (ACC) to the accumulator 56, by adjusting the input clock CLKIN. In the clock timing adjustment performed by the clock timing adjustment circuits CTA1, CTA2, and CTA3, as shown in FIG. 14(b), the clock CLK (RA) is delayed by time Tpd1 with respect to the clock CLK (MPY), and the clock CLK (ACC) is delayed by time Tpd2 with respect to the clock CLK (MPY). With this arrangement, as shown in FIG. 15, the multiplier 55 is always allowed to perform its time-consuming processing for the time Tpd2 before high-speed processing of the accumulator 56 is started. As a result, the multiplier 55 functions correctly. Because the clock frequency observed from outside is constant, the operating frequency of the product-and-sum calculator is increased in a practical sense.

By thus using the present timing adjustment system so as to perform borrowing of the delay time between (i) a block that operates at a low speed and (ii) a block that operates at a high speed, it is possible to optimize processing time of the LSI 1 as a whole.

If the number of blocks is very large, and therefore an algorithm of delay-time borrowing is complex, it is preferable that the processing is performed by a method such as the genetic algorithm, so as to adjust a large number of parameters combined with data transmission paths.

Figure 16:
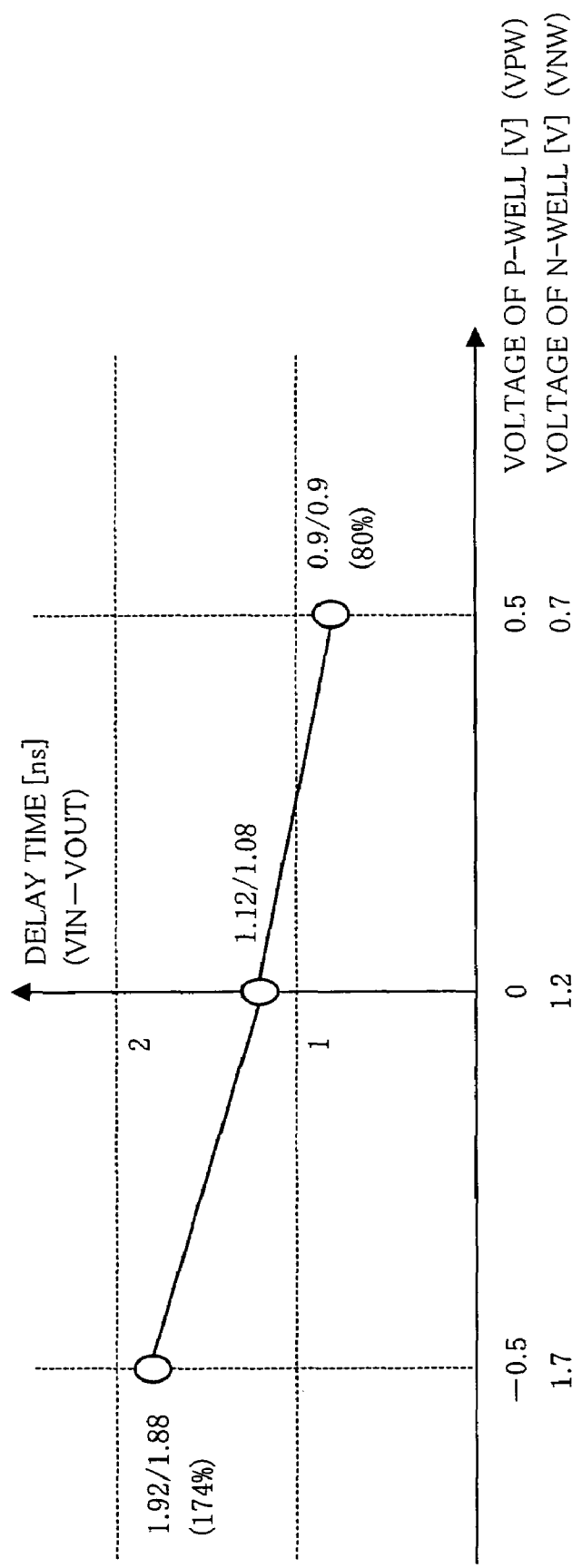
FIG. 16 is a graph illustrating an effect of the delay-time adjustment performed by the timing adjustment system.

FIG. 16 illustrates a delay-time adjustment effect (a simulation result) brought about by the clock timing adjustment circuit CTA.

As shown in FIG. 16, in case the well voltages are not adjusted (in case the voltage of the P-well=0V and the voltage of the N-well=1.2V), the delay time is 1.0 ns, which is an average value of (i) delay time (1.12 ns) at a rise of the pulse and (ii) delay time (1.08 ns) at a fall of the pulse. However, when reverse bias voltages (voltages that increases the threshold voltage; the voltage of the P-well=−0.5V, and the voltage of the N-well=1.7V) are respectively applied to a P-well and an N-well, the delay time (an average value of (i) delay time (1.92 ns) at rise and (ii) delay time (1.88 ns) at fall) is 0.90 ns, which is 20% shorter. From this result, it is found that a sufficient adjustment range is ensured by adjusting the well voltages.

It is estimated that a limit of each forward bias voltage is approximately 0.5V because of a leak current at a PN junction. However, a reverse bias voltage is such that it is possible to increase a bias value, thereby increasing a delay amount.

Figure 17:
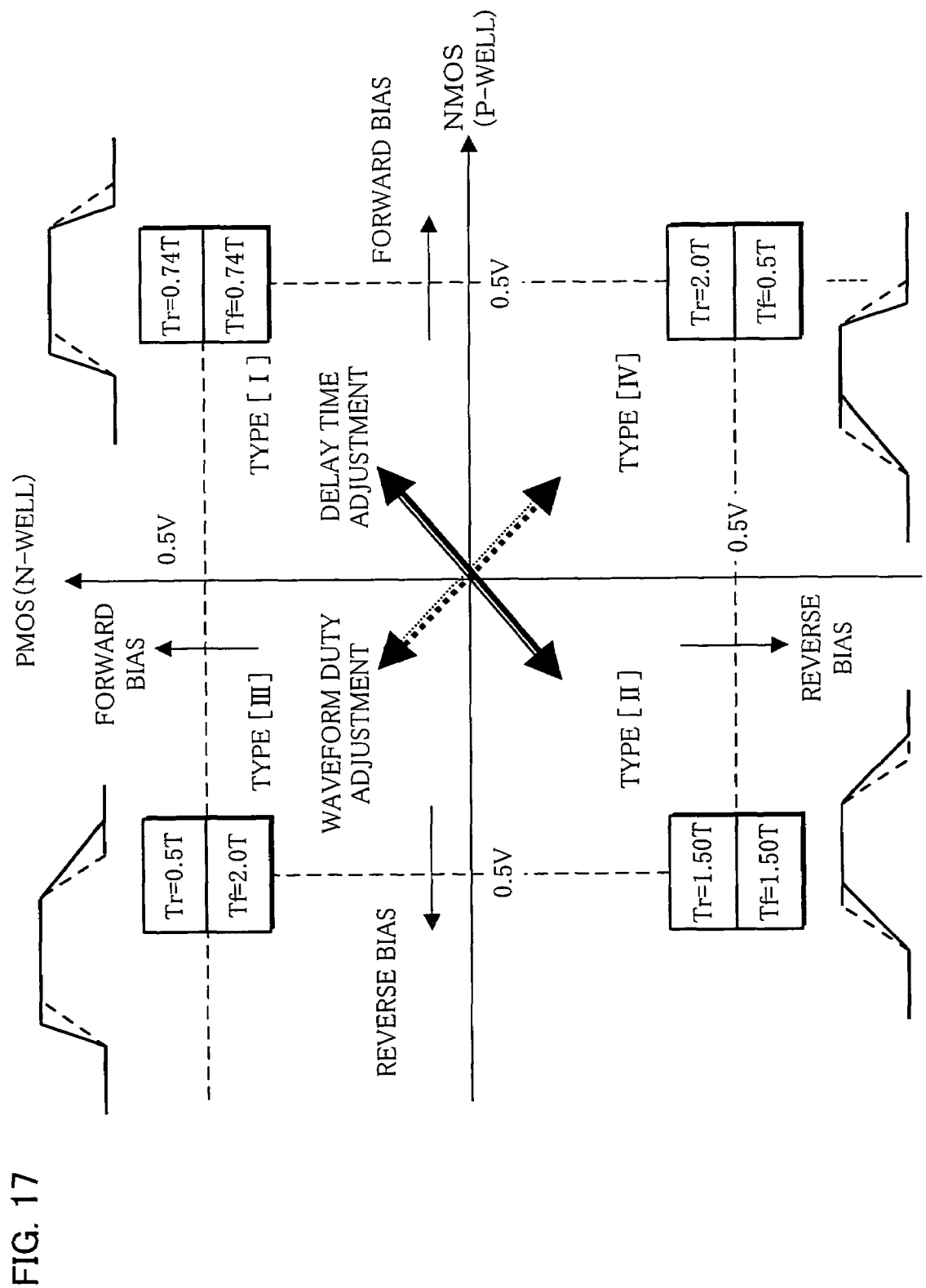
FIG. 17 is a diagram illustrating an effect of an adjustment of a duty cycle of a clock performed by the timing adjustment system.
Figure 18:
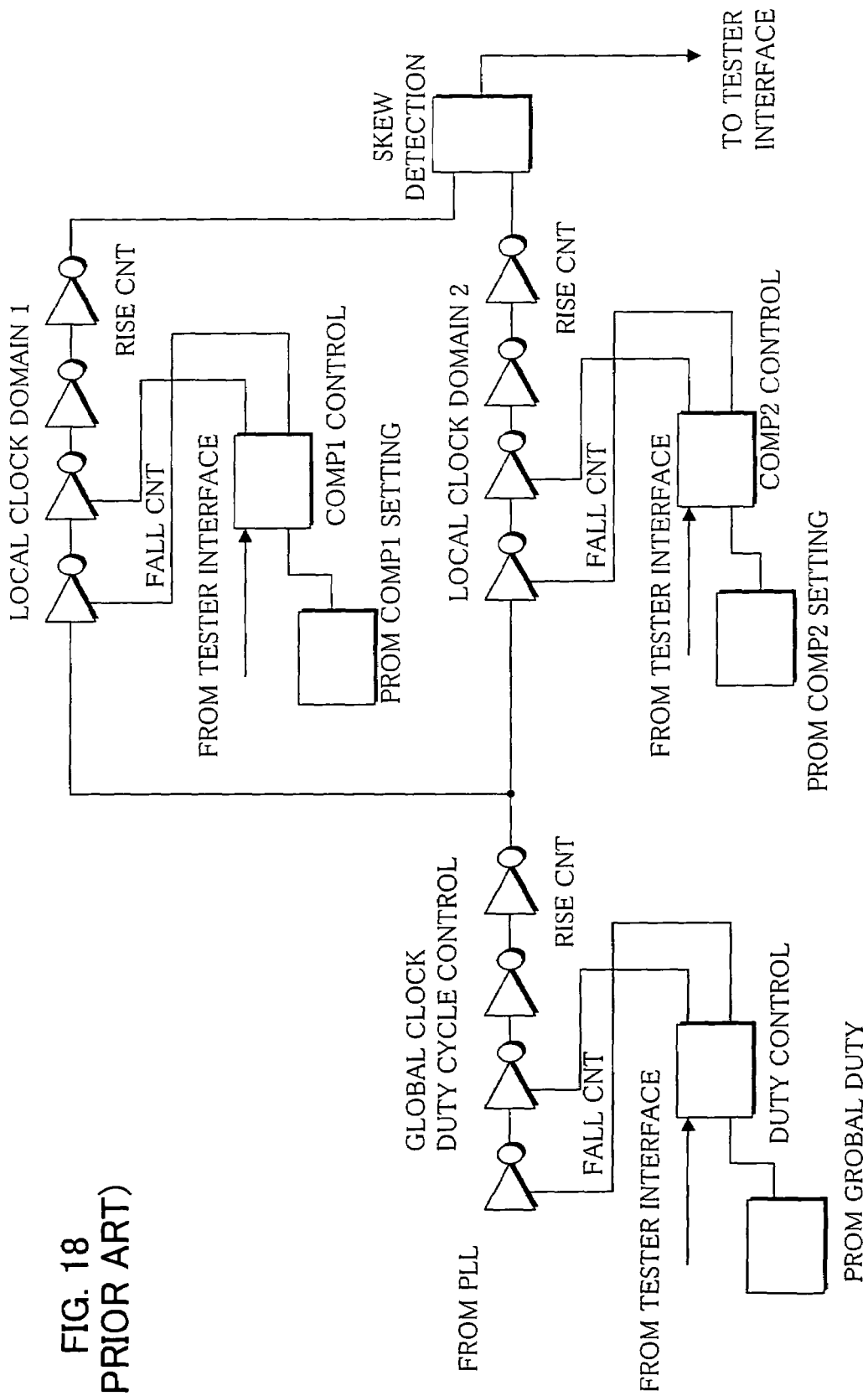
FIG. 18 is a circuit diagram illustrating an arrangement of a conventional circuit for detecting and adjusting a clock skew.
Figure 19:
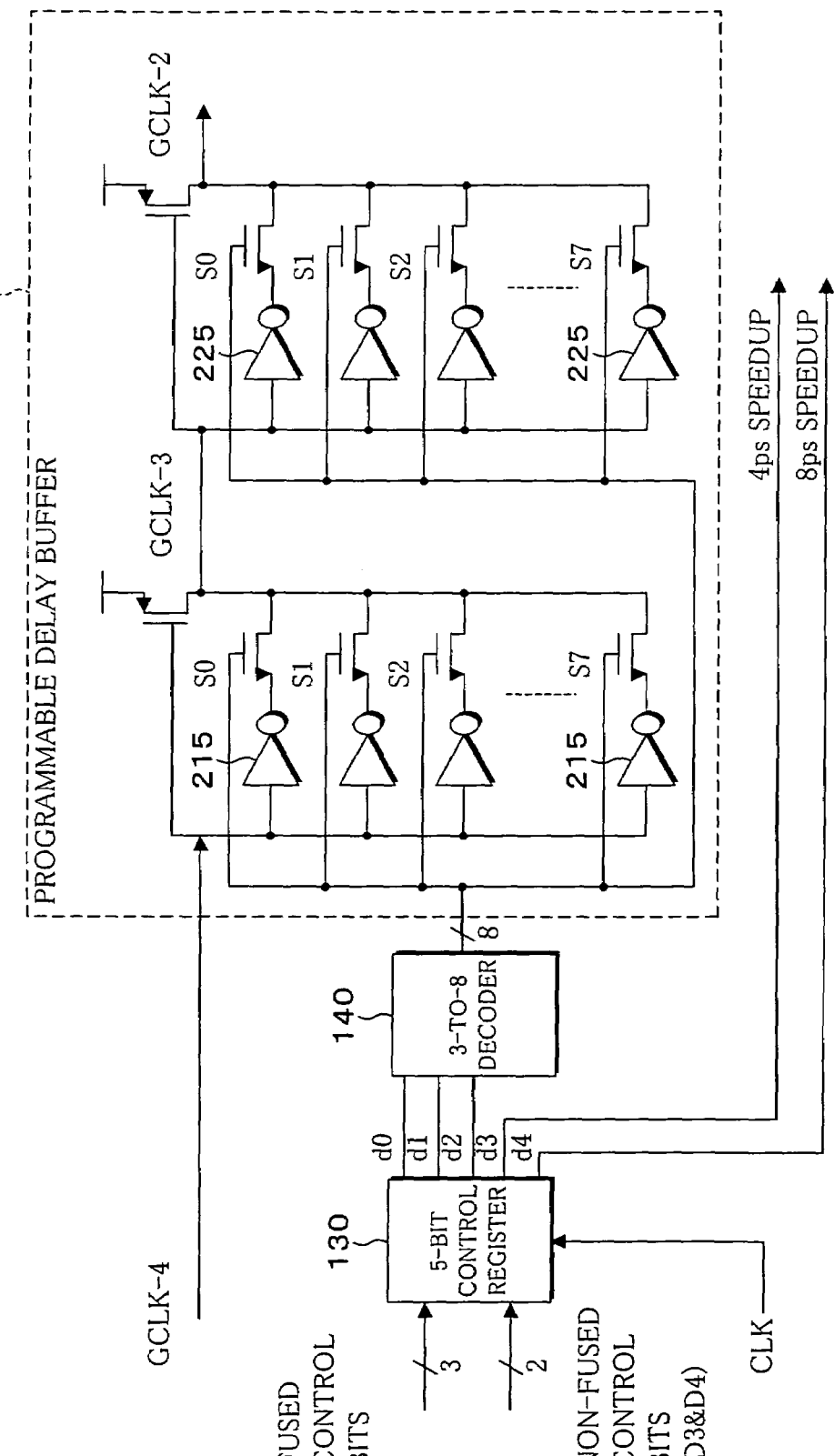
FIG. 19 is a circuit diagram illustrating an arrangement of a conventional clock-skew compensating circuit.

FIG. 17 illustrates that, by adjusting rising and falling properties of a waveform in addition to delaying timings, the present adjustment system becomes very effective in adjusting a duty cycle of a clock.

As shown in FIG. 17, when forward bias voltages (type I) are respectively applied to the P-well and the N-well, and when reverse bias voltages (type II) are respectively applied to the P-well and the N-well, the delay of timings are increased or decreased, as shown in FIG. 16. When, as in type III and type IV, a forward bias voltage is applied to one of the P-well and the N-well, and a reverse bias voltage is applied to the other of the P-well and the N-well, a waveform duty cycle changes. This is very effective in performing a timing adjustment for a circuit using both edges of a clock as in a high-speed circuit and the like.

The timing adjustment by the present timing adjustment system can be performed for a timing adjustment of a signal other than a clock, for a defect-analysis of an LSI, and for a through rate adjustment of a signal waveform.

As described above, a signal timing adjustment device of the present invention includes: a voltage generating section for generating a plurality of adjustment voltages; a voltage selecting section for selecting, from the plurality of adjustment voltages, an adjustment voltage that is in accordance with a delay-time adjustment amount, which is set so that delay time of each circuit block in an integrated circuit becomes closer to an average value of the delay time, the delay time being time between an input of data to the circuit block and an output of the data from the circuit block; and a delay-adjustment section for increasing or decreasing the delay time by using a transistor at which a threshold voltage changes in accordance with a value of the adjustment voltage selected.

According to this arrangement, the voltage selecting section selects, from the plurality of adjustment voltages, the adjustment voltage that is in accordance with the delay-time adjustment amount, and then the delay-adjustment section changes, so as to increase or decrease the delay time, the threshold voltage of the transistor in accordance with the value of the adjustment voltage selected. As a result, the delay time of each circuit block is adjusted to a value close to the average value of the delay time. Because the delay time is adjusted in accordance with the value of the adjustment voltage that is set in advance so that the difference between the circuit blocks becomes smaller, an adjustment parameter is the voltage only. Therefore, it is possible to broaden the adjustment range and to increase the adjustment fineness by simply changing the adjustment voltages continually or increasing the number of the adjustment voltages. Thus, freedom of adjustment is ensured without increasing the circuit size.

It is preferable that the signal timing adjustment device includes a delay measurement section for measuring the delay time. With this arrangement, the signal timing adjustment device can consistently perform processing of measuring the delay time, generating the adjustment voltages, selecting one of the adjustment voltages, and adjusting the delay time.

It is preferable that, in the signal timing adjustment device, the delay measurement section includes: a pulse generating section for generating a pulse in synchronization with a high-speed clock, and shifting a generation timing of the pulse in an increment of one clock of the high-speed clock; a latch that acquires and holds, in synchronization with a low-speed clock, data supplied from the circuit block; and a register that acquires and holds, in synchronization with the pulse, the data supplied from the circuit block.

According to this arrangement, the data supplied from the circuit block is acquired and held by the register in synchronization with the pulse generated by the pulse generating section, and is acquired by the latch in synchronization with the low-speed clock. Because the latch acquires the data in synchronization with the low-speed clock, the latch always acquires correct data stably. The correct data and the data held by the register are compared. If the correct data and the data held by the register match, it means that the data held by the register is also correct. In this case, the delay time of the circuit block can be measured from a timing at which the data is acquired by the latch and a timing at which the correct data is acquired by the register.

Moreover, because the pulse that is in synchronization with the high-speed clock determines the timing at which the data is acquired by the register, the register can acquire the data within, at an earliest, one clock of the high-speed clock from when the data is outputted from the circuit block. Therefore, the delay time can be specified with accuracy of the high-speed clock.

Furthermore, the generation timing of the pulse is shifted in an increment of one clock of the high-speed clock. Therefore, in case the data of the register and the data of the latch mismatch, it is possible, by shifting the pulse so as to adjust the timing at which the register receives the data, to specify a time period in which the data of the register and the data of the latch match.

In case the data of the register and the data of the latch match, but the data is not acquired by the register at an earliest timing from when the data is outputted from the circuit block, it is possible to specify the earliest timing by similarly shifting the pulse. That is, by adjusting the timing at which the data is acquired by the register when the data of the register and the data of the latch match, it is possible to specify the timing at which the data is acquired by the register at the earliest timing from when the data is outputted from the circuit block. Therefore, it is possible to measure the delay time with high accuracy.

It is preferable that, in the signal timing adjustment device, a well of the transistor is separated from a well of another circuit that is formed on a same substrate; and the adjustment voltage selected is applied to the well of the transistor. By separating the well of the transistor of the delay-adjustment section from the well of another circuit, it is possible to apply, independently from the another circuit, the well voltage values that are in accordance with the delay-time adjustment amount for the transistor. Therefore, it is easy to perform a desired adjustment.

It is preferable that all members of the signal timing adjustment device are contained in the integrated circuit. With this arrangement, it is possible to measure the delay time accurately, without being affected by a stray capacitance and the like caused by an LSI package and a measurement system.

It is preferable that the signal timing adjustment device contained in the integrated circuit includes a fixing section for fixing the delay-time adjustment amount. With this arrangement, even after the shipment of the integrated circuit, and even if the delay-time adjustment amount is not supplied from an external device, the delay-adjustment section can perform the timing adjustment by using a delay-time adjustment amount fixed by the fixing section.

A signal timing adjustment system of the present invention includes any one of the foregoing signal timing adjustment devices, a delay measurement section for measuring the delay time; a delay measurement section for measuring the delay time; an average value calculating section for calculating the average value of the delay time, the delay time having been measured by the delay measurement section; and an adjustment amount setting section for setting the delay-time adjustment amount so that a difference between the delay time and the average value becomes smaller, the average value having been calculated by the average value calculating section.

According to this arrangement, the adjustment amount setting section adjusts the delay-time adjustment amount so that the difference between the delay time and the average value becomes smaller, the average value having been calculated by the average value calculating section. As a result, the delay-time adjustment amount to be supplied to the signal timing adjustment device is generated. By thus providing the average value calculating section and the adjustment amount setting section separately from the signal timing adjustment device, it is possible to perform the timing adjustment efficiently.

In the signal timing adjustment system, a signal timing adjustment amount setting program of the present invention causes a computer to function as the average value calculating section and the adjustment amount setting section. Therefore, it is easy to set the delay-time adjustment amount and a set value by using an external device such as an LSI tester.

By storing the signal timing adjustment amount setting program in a computer-readable storage medium, it is possible to execute the signal timing adjustment amount setting program by using an arbitrary computer.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A signal timing adjustment device, comprising:
    a voltage generating section for generating a plurality of adjustment voltages;
    a voltage selecting section for selecting, from the plurality of adjustment voltages, an adjustment voltage for each of a plurality of circuit blocks in an integrated circuit that is in accordance with a delay-time adjustment amount, which is set so that delay time of each circuit block in the integrated circuit becomes closer to an average value of the delay time of all of the plurality of circuit blocks, the delay time being time between an input of data to a circuit block and an output of the data from the circuit block; and
    a delay-adjustment section for increasing or decreasing the delay time of each circuit block by using transistors at which threshold voltages change in accordance with values of the adjustment voltages selected.

2. The signal timing adjustment device as set forth in claim 1, further comprising:
    a delay measurement section for measuring the delay time.

3. A signal timing adjustment device, comprising:
    a voltage generating section for generating a plurality of adjustment voltages;
    a voltage selecting section for selecting, from the plurality of adjustment voltages, an adjustment voltage for each of a plurality of circuit blocks in an integrated circuit that is in accordance with a delay-time adjustment amount, which is set so that delay time of each circuit block in the integrated circuit becomes closer to an average value of the delay time of all of the plurality of circuit blocks, the delay time being time between an input of data to a circuit block and an output of the data from the circuit block;
    a delay-adjustment section for increasing or decreasing the delay time of each circuit block by using transistors at which threshold voltages change in accordance with values of the adjustment voltages selected; and
    a delay measurement section for measuring the delay time, wherein:
    the delay measurement section includes
    a pulse generating section for generating a pulse in synchronization with a high-speed clock, and shifting a generation timing of the pulse in an increment of one clock of the high-speed clock;
    a latch that acquires and holds, in synchronization with a low-speed clock, data supplied from the circuit block; and
    a register that acquires and holds, in synchronization with the pulse, the data supplied from the circuit block.

4. The signal timing adjustment device as set forth in claim 1, wherein:
    a well of the transistor is separated from a well of another circuit that is formed on a same substrate; and
    the adjustment voltage selected is applied to the well of the transistor.

5. The signal timing adjustment device as set forth in claim 1, the signal timing adjustment device being contained in the integrated circuit.

6. The signal timing adjustment device as set forth in claim 5, further comprising:
    a fixing section for fixing the delay-time adjustment amount.

7. A signal timing adjustment system, comprising:
    a signal timing adjustment device, including
        a voltage generating section for generating a plurality of adjustment voltages;
        a voltage selecting section for selecting, from the plurality of adjustment voltages, an adjustment voltage for each of a plurality of circuit blocks in an integrated circuit that is in accordance with a delay-time adjustment amount, which is set so that delay time of each circuit block in the integrated circuit becomes closer to an average value of the delay time of all of the plurality of circuit blocks, the delay time being time between an input of data to a circuit block and an output of the data from the circuit block; and
        a delay-adjustment section for increasing or decreasing the delay time of each circuit block by using transistors at which threshold voltages change in accordance with values of the adjustment voltages selected;
    a delay measurement section for measuring the delay time;
    an average value calculating section for calculating the average value of the delay time, the delay time having been measured by the delay measurement section; and
    an adjustment amount setting section for setting the delay-time adjustment amount so that a difference between the delay time and the average value becomes smaller, the average value having been calculated by the average value calculating section.

8. A computer program product comprising a computer readable storage medium, having encoded thereon computer readable program instructions executable by computer that cause the computer to adjust signal timing for a plurality of circuit blocks of an integrated circuit by directing performing the steps of:
    measuring a delay time between an imput of data to each circuit block and an output of the data from said each circuit block;
    determining an average value of the delay time of all of the plurality of circuit blocks;

generating a plurality of adjustment voltages for increasing or decreasing the delay time of each circuit block by changing threshold voltages of transistors;

setting a delay-time adjustment amount so that a difference between the delay time of each circuit block and the average value becomes smaller, and selecting, from the plurality of adjustment voltages, and adjustment voltage that is in accordance with delay-time adjustment amount.

* * * * *

UNITED STATES PATENT AND TRADEMARK OFFICE
CERTIFICATE OF CORRECTION

PATENT NO. : 7,447,289 B2  Page 1 of 1
APPLICATION NO. : 10/809374
DATED : November 4, 2008
INVENTOR(S) : Munehiro Uratani et al.

It is certified that error appears in the above-identified patent and that said Letters Patent is hereby corrected as shown below:

Title page, item should read as follows: (73) Assignees:[[National Institute of Advanced Industrial Science and Technology, Tokyo]]

Signed and Sealed this

Twenty-eighth Day of April, 2009

JOHN DOLL
*Acting Director of the United States Patent and Trademark Office*